(12) United States Patent
Yui et al.

(10) Patent No.: US 7,662,699 B2
(45) Date of Patent: Feb. 16, 2010

(54) METHOD FOR FABRICATING SEMICONDUCTOR DEVICE

(75) Inventors: Hajime Yui, Tokyo (JP); Hisashi Muramatsu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 64 days.

(21) Appl. No.: 12/094,601

(22) PCT Filed: Nov. 24, 2005

(86) PCT No.: PCT/JP2005/021605

§ 371 (c)(1),
(2), (4) Date: May 21, 2008

(87) PCT Pub. No.: WO2007/060724

PCT Pub. Date: May 31, 2007

(65) Prior Publication Data

US 2009/0162993 A1    Jun. 25, 2009

(51) Int. Cl.
*H01L 21/00* (2006.01)

(52) U.S. Cl. ...................... 438/460; 438/462

(58) Field of Classification Search .......... 438/460–464
See application file for complete search history.

(56) References Cited

U.S. PATENT DOCUMENTS 5,786,266 A * 7/1998 Boruta ...................... 438/462
5,913,104 A * 6/1999 Piper et al. ................... 438/14

FOREIGN PATENT DOCUMENTS

| JP | 5-90406 A | 4/1993 |
|----|-----------|--------|
| JP | 6-224298 A | 8/1994 |
| JP | 9-1542 A | 1/1997 |
| JP | 11-233458 A | 8/1999 |
| JP | 2002-43254 A | 2/2002 |
| JP | 2002-75919 A | 3/2002 |

OTHER PUBLICATIONS

*Semiconductor Manufacturing Handbook*, published 2005, Edited by Hwaiyu Geng, pp. 20.8-20.13.

* cited by examiner

*Primary Examiner*—Richard A. Booth
(74) *Attorney, Agent, or Firm*—Miles & Stockbridge P.C.

(57) ABSTRACT

An object is to provide a technology capable of improving a manufacturing yield of semiconductor devices by preventing scattering of irregular-shaped scraps formed at the time of dicing. To achieve the above object, for dicing lines, by which an irregular-shaped outer periphery may possibly be cut off, among a plurality of dicing lines, formation of the dicing lines starts from an outside of a semiconductor wafer, and after the semiconductor wafer is cut off partway, formation of the dicing lines is ended before reaching the irregular-shaped outer periphery formed on a outer periphery of the semiconductor wafer. For other dicing lines, formation of the dicing lines starts from the outside of the semiconductor wafer, and after the semiconductor wafer is cut off, is ended outside the semiconductor wafer.

25 Claims, 28 Drawing Sheets

METHOD FOR FABRICATING SEMICONDUCTOR DEVICE

TECHNICAL FIELD

The present invention relates to a technology of manufacturing semiconductor devices, and more particularly, to a technology effective in being applied to a dicing process for singulating a semiconductor wafer into a plurality of semiconductor chips.

BACKGROUND ART

Japanese Patent Application Laid-open Publication No. 9-1542 (Patent Document 1) discloses a technology in which, in a cutting process for cutting a thin-plate material such as a semiconductor wafer into a plurality of members with a specified dimension, damages of a blade and the thin-plate material which are caused when scraps existing on a periphery of the thin-plate material are scattered and hit the blade and the thin-plate material are avoided. Specifically, a cutting stroke (cutting area) along the semiconductor wafer is set to be shorter than the entire length of a scribe-line, thereby leaving an uncut part on the periphery of the semiconductor wafer.

Japanese Patent Application Laid-open Publication No. 2002-43254 (Patent Document 2) discloses a technology in which dicing is performed by a dicing apparatus including a means that detects an outer end of a semiconductor wafer. Specifically, data of the outer end detected by the means that detects the outer end of the semiconductor wafer is stored, and based on this data, cutting starts from an inner side within a predetermined area from one side of the outer end. Thereafter, cutting is performed from an inner side within a predetermined area from the other side of the outer end.

Japanese Patent Application Laid-open Publication No. 5-90406 (Patent Document 3) discloses a technology in which, in cutting a semiconductor wafer, a first cutting line for dicing from an outside of a periphery of the semiconductor wafer and a second cutting line for dicing from an inside of the periphery of the semiconductor wafer are alternately provided in both vertical and horizontal dicing directions.

Japanese Patent Application Laid-open Publication No. 6-224298 (Patent Document 4) discloses an improved method of dicing a semiconductor wafer with fewer occurrences of defective portions even when cutting-off is resumed after once cutting-off is suspended to remove a semiconductor wafer from a dicing table. Specifically, the semiconductor wafer is cut off so that a partially-uncut portion is left on a cutting line. Then, cutting-off is suspended to remove the semiconductor wafer from the dicing table. Then, the blade is replaced and cutting off of the semiconductor wafer is started again. At this time, the partially-uncut portion is cut off on the cutting line.

Also, a technology of forming one dicing line in a two-stage cutting step (step-cutting) is disclosed (Non-Patent Document 1).

Patent Document 1: Japanese Patent Application Laid-open Publication No. 9-1542
Patent Document 2: Japanese Patent Application Laid-open Publication No. 2002-43254
Patent Document 3: Japanese Patent Application Laid-open Publication No. 5-90406
Patent Document 4: Japanese Patent Application Laid-open Publication No. 6-224298
Non-Patent Document 1: SEMICONDUCTOR MANUFACTURING HANDBOOK, refer to ITEM 20.4.2

DISCLOSURE OF THE INVENTION

In a process of manufacturing a semiconductor device, circuit elements and multilayer interconnections are formed on a chip region of a semiconductor wafer through a so-called front-end process. Then, the semiconductor wafer formed with the circuit elements and the multilayer interconnections is cut into individual semiconductor chips in the dicing process, which is a part of a so-called back-end process.

The dicing process is performed by mounting the semiconductor wafer on a dicing frame onto which a dicing tape is attached, and by cutting off the semiconductor wafer along scribe-lines formed vertically and horizontally on the semiconductor wafer. A plurality of dicing lines, which are cutting lines formed in this dicing process, each completely cut off the semiconductor wafer. That is, the dicing lines formed vertically and horizontally on the semiconductor wafer cut off the semiconductor wafer from one end to the other end to separate semiconductor chips.

However, while the semiconductor wafer has a substantially circular shape, the semiconductor chips which are singulated have a rectangular shape. That is, conforming items of the rectangular shape can be obtained at a center portion of the semiconductor wafer, but, on an outer periphery of the semiconductor wafer, irregular-shaped scraps each having a shape different from the rectangular shape, such as a triangular shape, are formed. That is, when the dicing lines are formed so that the semiconductor wafer is completely cut off, the scraps of such as a triangular shape are separated to be generated on the outer periphery of the semiconductor wafer. Since dicing is performed with the semiconductor wafer being attached onto the dicing tape, the scraps of the triangular shape are also normally attached onto the dicing tape.

However, a size of the semiconductor chips to be singulated from the semiconductor wafer has become smaller. Accordingly, intervals between the dicing lines formed on the semiconductor wafer have become narrower. For this reason, a size of the scraps formed by dicing becomes smaller. Particularly, a semiconductor chip for use as a driver of a liquid-crystal display device has, for example, the rectangular shape, and the intervals between the dicing lines formed in a short-side direction of the rectangle becomes narrower.

As the scraps formed through dicing becomes smaller, an adhesive area to the dicing tape becomes smaller, so that an adhesive force between the scraps and the dicing tape is decreased. For this reason, at the moment of separation of the scraps by dicing, the scraps are scattered by force of dicing, and make contact with the surface of the conforming chips formed on the semiconductor wafer depending on a scattering direction. As a result, the conforming chips are damaged, thereby causing a problem of decreasing a manufacturing yield.

An object of the present invention is to provide a technology capable of improving the manufacturing yield of the semiconductor devices by preventing scattering of irregular-shaped scraps formed at the time of dicing.

The above-mentioned and other objects and novel features of the present invention will be apparent from the description of the present specification and accompanying drawings.

Represented ones of the present inventions disclosed in the present application will be briefly described as follows.

one aspect disclosed in the present application comprises the following steps: (a) forming a first dicing line group including a plurality of first dicing lines by dicing along a first direction of a semiconductor wafer; and (b) forming a second dicing line group including a plurality of second dicing lines by dicing the semiconductor wafer along a second direction perpendicular to the first direction, wherein in the (a) step, dicing starts from an outside of the semiconductor wafer, and after cutting off the semiconductor wafer, dicing is ended outside the semiconductor wafer, and the (b) step includes the steps of: (b1) starting dicing from the outside of the semiconductor wafer, and after cutting off the semiconductor wafer, ending dicing outside the semiconductor wafer; and (b2) starting dicing from the outside of the semiconductor wafer and ending dicing inside the semiconductor wafer.

Effectives obtained by the representative one among the inventions disclosed in the present application will be briefly described as follows.

Since the dicing lines are formed so as not to cut out the irregular-shaped scraps formed on the outer periphery of the semiconductor wafer, the scraps are prevented from being cut out from the semiconductor wafer. Therefore, since there is no case where the conforming chips are damaged because the scraps are cut out and scattered over the conforming chips of the semiconductor, the manufacturing yield of the semiconductor devices can be improved.

BRIEF DESCRIPTIONS OF THE DRAWINGS

BEST MODE FOR CARRYING OUT THE INVENTION

Figure 1:
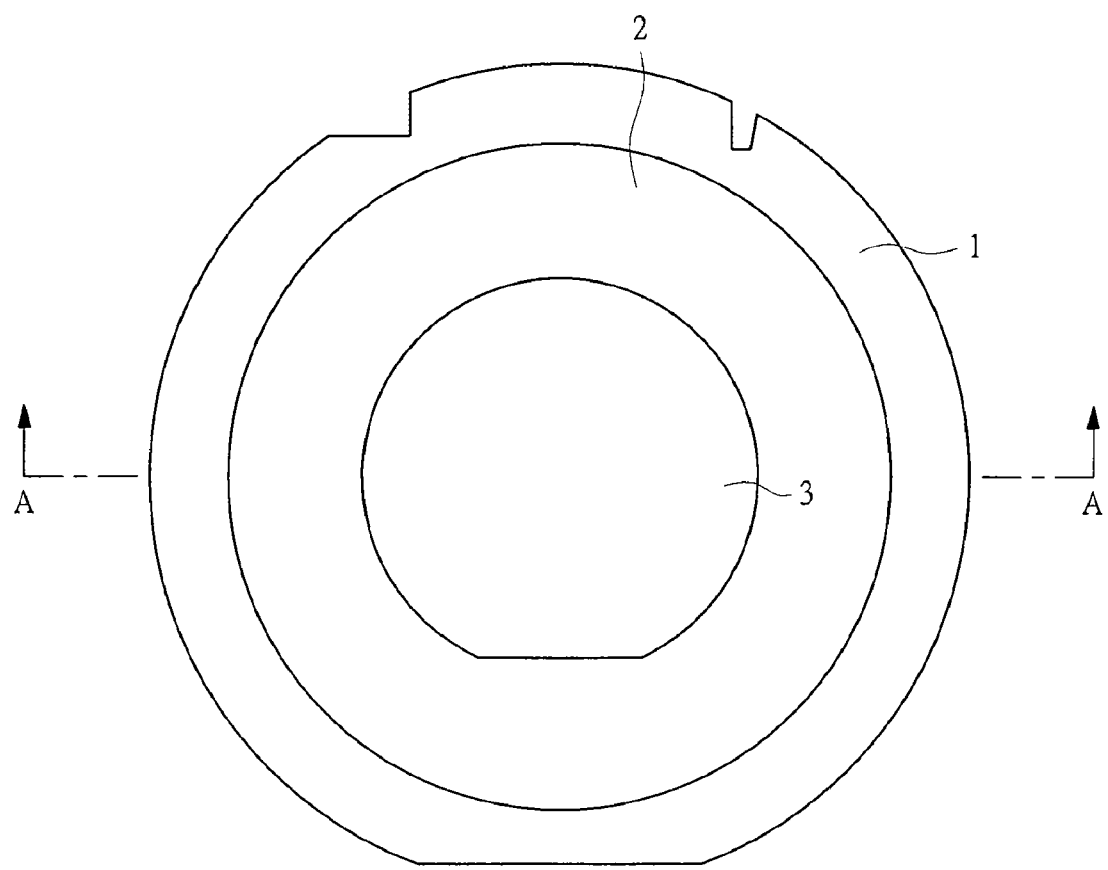
FIG. 1 is a plan view showing a state where a semiconductor wafer is placed in a dicing frame to which a dicing tape attached.

Prior to detailed description of the present invention, the meaning of terms in the present applications are described as follows.

A semiconductor wafer is a silicon monocrystalline substrate (generally, an approximately flat circular shape), a sapphire substrate, a glass substrate, and other insulating or non-insulating semiconductor substrates as well as a composite substrate thereof, which are used in manufacturing an integrated circuit. In addition, the semiconductor devices in the present application are not only the semiconductor devices formed on the silicon wafer, sapphire substrate, or the like, but also the semiconductor devices such as Thin-Film-Transistor (TFT) and Super-Twisted-Nematic (STN) liquid crystal formed on other insulating substrate such as glass are included, especially unless it is stated that they are not used.

Dicing is to cut off a semiconductor wafer on which many semiconductor devices are fabricated, and to separate the semiconductor wafer into individual semiconductor chips.

A dicing line is an individual cutting line for cutting the semiconductor wafer, and is normally formed along a first direction of a semiconductor wafer and a second direction perpendicular to the first direction.

A dicing line group is comprised of the plurality of dicing lines formed along a predetermined direction.

A outer periphery is an area which becomes shapes different from the shape of a normal conforming chip but does not become scraps when being cut by the dicing lines perpendicular to each other.

An irregular-shaped outer periphery is an area which becomes substantially triangular shapes within the area becoming the shapes different from the shape of a normal conforming semiconductor chip, and which becomes scraps when being cut along the dicing lines perpendicular to each other. Therefore, the irregular-shaped outer periphery is an area smaller than the outer periphery.

Scraps are those having a substantially triangular shape generated when the irregular-shaped outer periphery is cut and also having a low adhesive force due to a small adhesive area to a dicing tape and therefore having a possibility of scattering at the time of dicing.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, the same components are denoted by the same reference symbols throughout the drawings for describing the embodiments in principle, and the repetitive description thereof is omitted.

First Embodiment

In a first embodiment, a method of manufacturing a Liquid Crystal Display (LCD) driver (semiconductor device) for use in a liquid-crystal display apparatus is described.

First, on a chip area of a semiconductor wafer with a substantially disk shape, a circuit element, such as Metal Insulator Semiconductor Field Effect Transistor (MISFET), is formed by using a well-known technology. Then, on an upper layer of the MISFET formed on the semiconductor wafer, a multilayer interconnection is formed. The multilayer interconnection is formed of, for example, metal wiring made of, for example, an aluminum film or an aluminum-alloy film with aluminum as a base metal, through an inter-layer insulating film composed of, for example, a silicon oxide film. Also, part or approximately all of layers forming the multilayer interconnections may be formed of copper films or films with copper as a base metal (damascene interconnection). Then, on the multilayer interconnection, a bump electrode made of, for example, a gold film, is formed. In this manner, the MISFET and the multilayer interconnection are formed on the semiconductor wafer.

Figure 2:
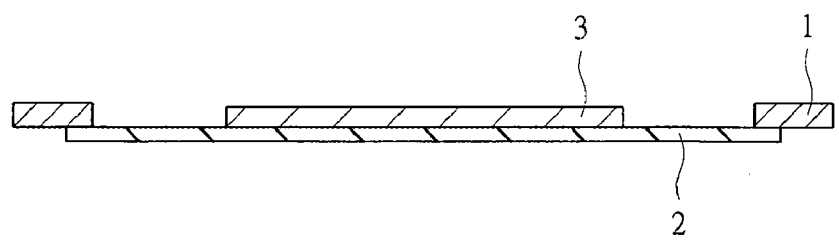
FIG. 2 is a cross-sectional view showing a cross-section taken along an A-A line in FIG. 1.

Next, as shown in FIGS. 1 and 2, a dicing frame 1 to which a dicing tape 2 with adhesiveness is attached is prepared. Then, a semiconductor wafer 3 is fixed on the dicing tape 2. The semiconductor wafer 3 is disposed so that its back surface is bonded to the dicing tape 2. The back surface is a surface opposite to an element formation surface (main surface) on which the MISFET and the multilayer interconnection are formed. Here, a material for adhesiveness of the dicing tape 2 in which its adhesiveness is decreased by irradiation of ultraviolet rays is used.

Figure 3:
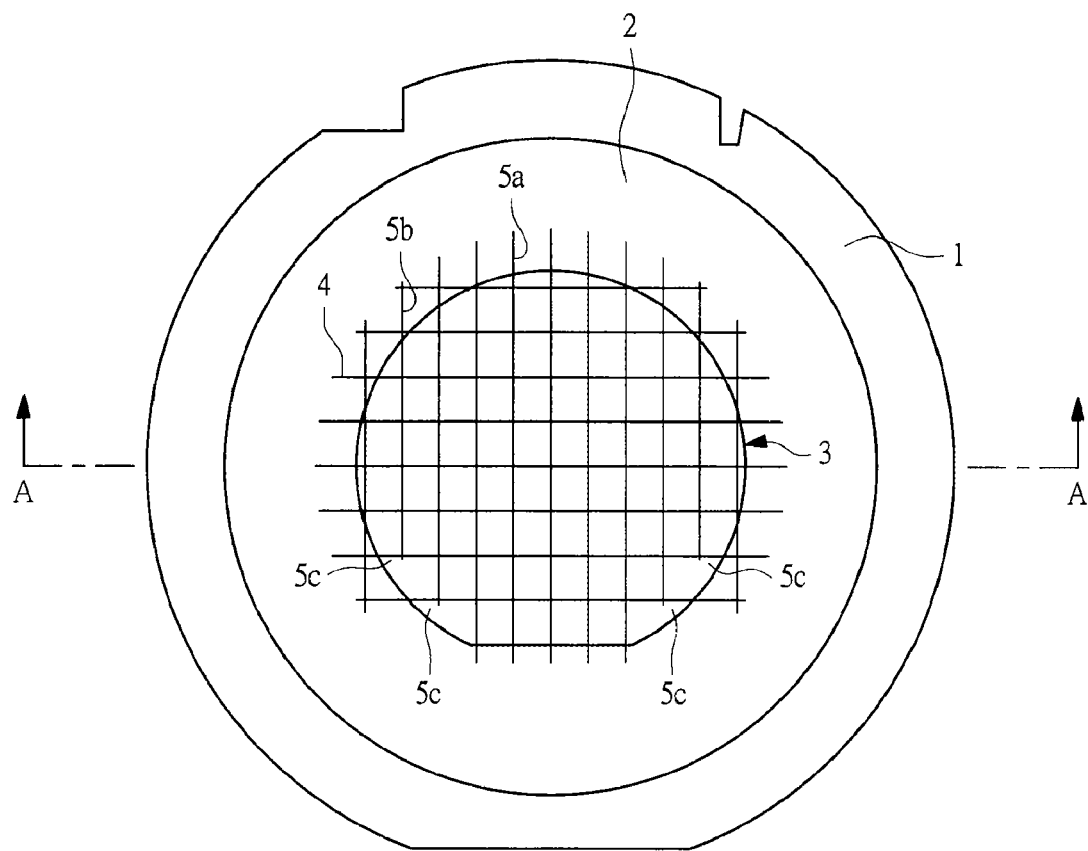
FIG. 3 is a plan view showing a state where dicing is performed according to a first embodiment of the present invention.
Figure 4:
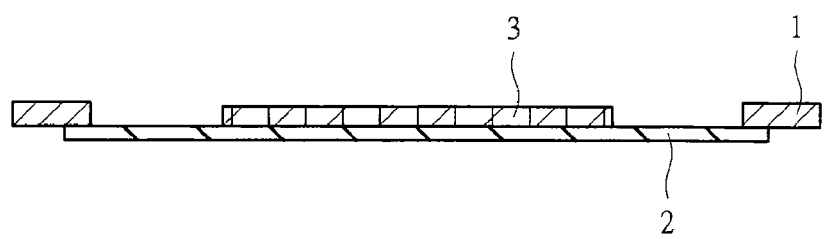
FIG. 4 is a cross-sectional view showing a cross-section taken along an A-A line in FIG. 3.

Next, as shown in FIGS. 3 and 4, dicing is performed on the semiconductor wafer 3 disposed on the dicing table 2 to be singulated into a plurality of semiconductor chips. With this dicing, the semiconductor wafer 3 is cut off vertically and horizontally to form a plurality of dicing lines on the semiconductor wafer 3. In a horizontal direction (first direction) of the semiconductor wafer 3, a plurality of dicing lines (first dicing lines) 4 are formed as a dicing line group in the first direction (first dicing line group). Each dicing line 4 is formed so as to start from the outside of the semiconductor wafer 3 and end outside the semiconductor wafer 3 after cutting off the semiconductor wafer 3. That is, each dicing line 4 completely cuts off the semiconductor wafer 3. On the other hand, in a direction perpendicular to the dicing lines 4 (vertical direction of the semiconductor wafer 3) (second direction), a plurality of dicing lines (second dicing lines) 5a and 5b are formed as a dicing line group in the second direction (second dicing line group). Here, it is described that the second direction is perpendicular to, but this does not intend to exclude the dicing lines crossing in a non-perpendicular state from the present invention. In the dicing line group formed on the semiconductor wafer 3 in the vertical direction (dicing lines 5a and 5b), the dicing lines 5a are formed, as with the dicing lines 4, so as to start from outside of the semiconductor wafer 3, and end outside the semiconductor wafer 3 after cutting off the semiconductor wafer 3. On the other hand, the dicing lines 5b are formed so as to start from the outside of the semiconductor wafer 3, and are formed so that the cutting-off is ended inside the semiconductor wafer 3.

In this manner, in the dicing line groups vertically and horizontally formed on the semiconductor wafer 3, concerning the dicing line group in one direction (for example, the vertical direction of the semiconductor wafer 3), a line that completely cuts off the semiconductor wafer 3 and a line that ends cutting off the semiconductor wafer 3 inside are present.

This is a feature of one aspect of the present invention disclosed in the present application. Since the semiconductor wafer 3 has a substantially disk shape, if it is cut off along the dicing lines linearly formed in the vertical and horizontal directions, rectangular-shaped semiconductor chips can be obtained in an area at the center of the semiconductor wafer 3. Here, the rectangular shape means a right-angle quadrilateral in which its four corners have a right angle, including a rectangle and a square. Although, in the present embodiment, a semiconductor chip shaped in a rectangle is mainly described as a rectangular-shaped semiconductor chip, it is needless to say that a semiconductor chip shaped in a square can be used.

On the other hand, on the outer periphery of the semiconductor wafer 3, the outer end of the semiconductor wafer 3 has a curved shape. Therefore, irregular-shaped outer peripheries 5c having a substantially triangular shape different from the rectangular shape are formed. These irregular-shaped outer peripheries 5c are areas each having the substantially triangular shape among areas each having a shape different from the shape of normal conforming semiconductor chips when being cut off by the dicing lines perpendicular to each other. Also, the irregular-shaped outer peripheries 5c are defined as areas where the scraps are formed. If these irregular-shaped outer peripheries 5c are cut off with the dicing lines, the scraps each having a substantially triangular shape are generated. These small scraps have a low adhesive force due to a small adhesive area to the dicing tape 2, and be scattered with the force of cutting through dicing. For example, this causes a problem that the surface of the conforming semiconductor chips is damaged if the scraps are scattered over the conforming semiconductor chips. Accordingly, the manufacturing yield of the semiconductor devices is decreased.

To get around this problem, in the first embodiment, as shown in FIG. 3, for the dicing lines 5b cutting off the irregular-shaped outer peripheries 5c, the cutting-off is ended before cutting off the irregular-shaped outer peripheries 5c. Accordingly, the irregular-shaped outer peripheries 5c are not cut off with the dicing lines 5b, thereby preventing scattering of scraps that would otherwise be formed by cutting off the irregular-shaped outer peripheries 5c. That is, in the first embodiment, in the dicing line group in the second direction (plurality of dicing lines 5a and 5b), only for the dicing lines 5b that would otherwise cut off the irregular-shaped outer peripheries 5c, the cutting-off is ended inside the semiconductor wafer 3. For the other dicing lines 5a, a cutting-off operation is performed up to the outside of the semiconductor wafer 3.

For example, the dicing lines 5b in which their cutting-off is ended inside the semiconductor wafer 3 are, for example, several dicing lines which otherwise may generate the scraps due to the cutting-off of the irregular-shaped outer peripheries 5c. Other dicing lines completely cut off the semiconductor wafer 3, as with the dicing lines 5a shown in FIG. 3. Therefore, the outer periphery including the irregular-shaped outer peripheries 5c is cut off with the dicing lines 5a via the several dicing lines 5b in which their cutting-off is ended inside the semiconductor wafer 3. However, since the several dicing lines 5b does not cut off the irregular-shaped outer peripheries 5c, the scraps, which would be formed if the irregular-shaped outer peripheries 5c are cut off with the dicing lines 5b, can be prevented from being scattered. That is, a size of the outer periphery cut off with the dicing lines 5a via the several dicing lines 5b is large. Therefore, the adhesive force to the dicing tape 2 is strong, so that the outer periphery which is cut off does not scatter.

On the other hand, as for the dicing line group in the first direction (plurality of dicing lines 4), these dicing lines are formed so as to start from the outside of the semiconductor wafer 3, and end outside the semiconductor wafer 3 after cutting off the semiconductor wafer 3. Similarly, the plurality of dicing lines 5a in the dicing line group in the second direction are formed so as to start from the outside of the semiconductor wafer 3, and end outside the semiconductor wafer 3 after cutting off the semiconductor wafer 3. Therefore, the dicing lines, other than the dicing lines 5b ending cutting off inside the semiconductor wafer 3, completely cut off the semiconductor wafer 3, so that a dicing width between the semiconductor chips is sufficiently expanded in a dicing-width expanding process which is described below. For this reason, picking-up can be performed while preventing contact between adjacent semiconductor chips, so that chipping and cracks of the semiconductor chips can be prevented.

The first embodiment is effective when a narrowly-interval dicing line group is required, such as a dicing line group for cutting a short side of a rectangular-shaped semiconductor chip having short sides and long sides, such as an LCD driver. If the irregular-shaped outer peripheries are cut off with this narrowly-interval dicing line group, the scraps with a small adhesive area tend to be formed. However, as in the first embodiment, it is configured such that several dicing lines, which would otherwise cut off the irregular-shaped outer peripheries 5c, end their cutting-off inside the semiconductor wafer 3, thereby preventing an occurrence of the scraps having a small adhesive area. Here, the number of dicing lines in which their cutting-off is ended inside the semiconductor wafer 3 is not restricted to be several lines, but may be more or less. The point is that the size of the outer periphery to be cut off should be formed into a size which keeps the adhesive force to the dicing tape 2 not to come off.

Figure 5:
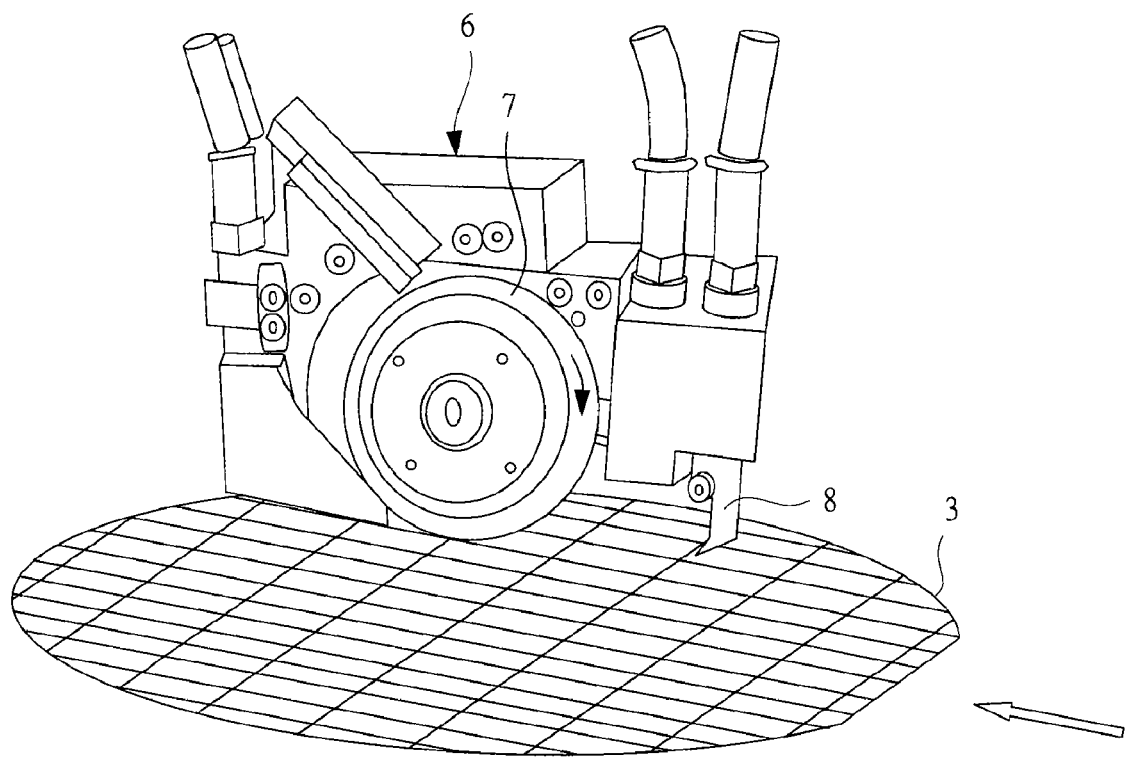
FIG. 5 is a drawing showing a dicing device for dicing a semiconductor wafer.

Next, the dicing process in the first embodiment will be further described. FIG. 5 is a drawing showing a dicing apparatus 6 that dices the semiconductor wafer 3. As shown in FIG. 5, the dicing apparatus 6 has a blade 7 and a blade cleaning nozzle 8. The blade 7 is configured to rotate to cut off the semiconductor wafer 3, and the blade cleaning nozzle 8 is configured to discharge cleaning water for cleaning the blade 7. In addition, although not shown in FIG. 5, a cutting-water nozzle for discharging cutting water for use in cutting off the semiconductor wafer 3 is provided at the back of the blade 7.

Next, the dicing operation by using the above-configured dicing apparatus 6 is described with reference to the drawings. First, in the dicing lines shown in FIG. 3, an operation of forming the dicing lines 4 and 5a that completely cut off the semiconductor wafer 3 is described.

Figure 6:
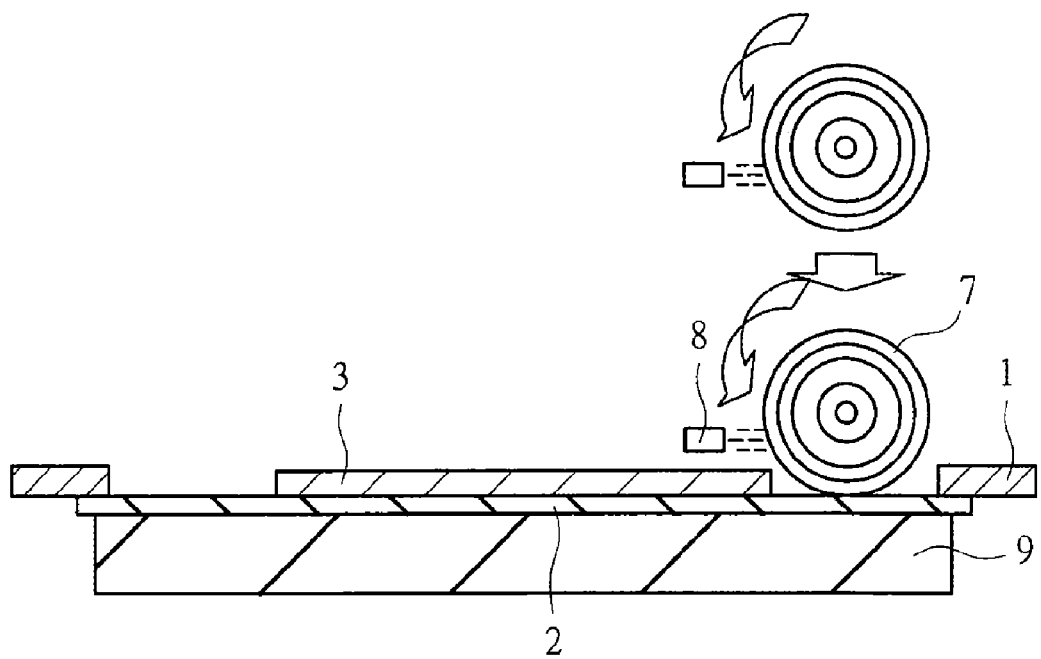
FIG. 6 is a partial cross-sectional view for describing a dicing operation.

As shown in FIG. 6, the semiconductor wafer 3 is contacted with a porous ceramic chuck 9 by vacuum. At this time, the semiconductor wafer 3 is disposed on the dicing tape 2 attached onto the dicing frame 1. Then, outside the semiconductor wafer 3, the rotating blade 7 is moved from an upside of the dicing tape 2 onto the dicing tape 2 so as to start dicing. That is, dicing starts from the outside of the semiconductor wafer 3.

Figure 7:
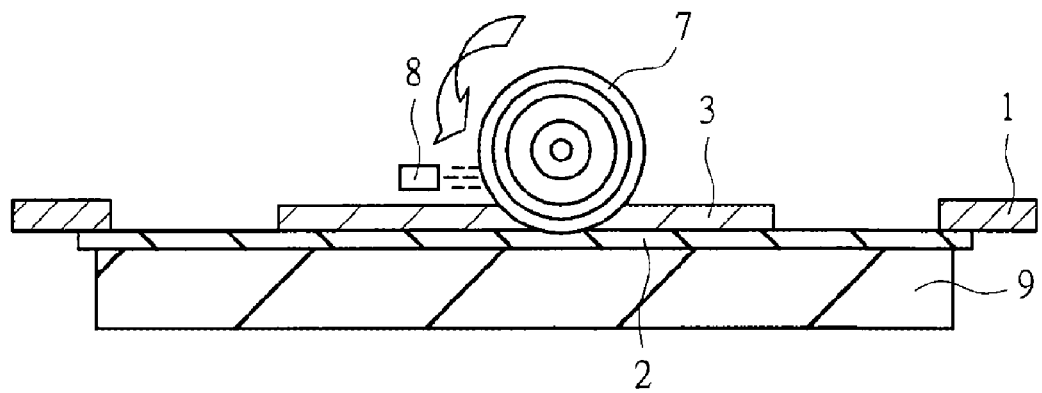
FIG. 7 is a partial cross-sectional view for describing the dicing operation continued from FIG. 6.
Figure 8:
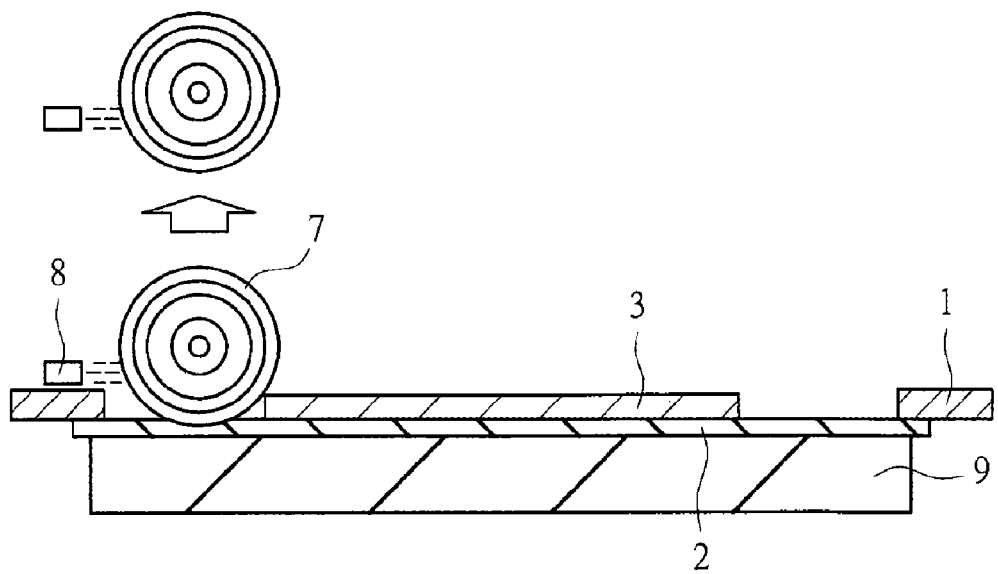
FIG. 8 is a partial cross-sectional view for describing the dicing operation continued from FIG. 7.

Next, as shown in FIG. 7, the blade 7 is moved as being rotated to cut off the semiconductor wafer 3. Then, as shown in FIG. 8, after cutting off the semiconductor wafer 3, dicing is performed up to the outside of the semiconductor wafer 3. Thereafter, when dicing is ended, the blade 7 is retracted from the dicing tape 2 upward outside the semiconductor wafer 3. By repeating this operation, the dicing line group in the first direction (plurality of dicing lines 4) and the plurality of dicing lines 5a of the dicing line group in the second direction can be formed.

Next, an operation of forming the dicing lines 5b that end dicing inside the semiconductor wafer 3 is described.

Figure 9:
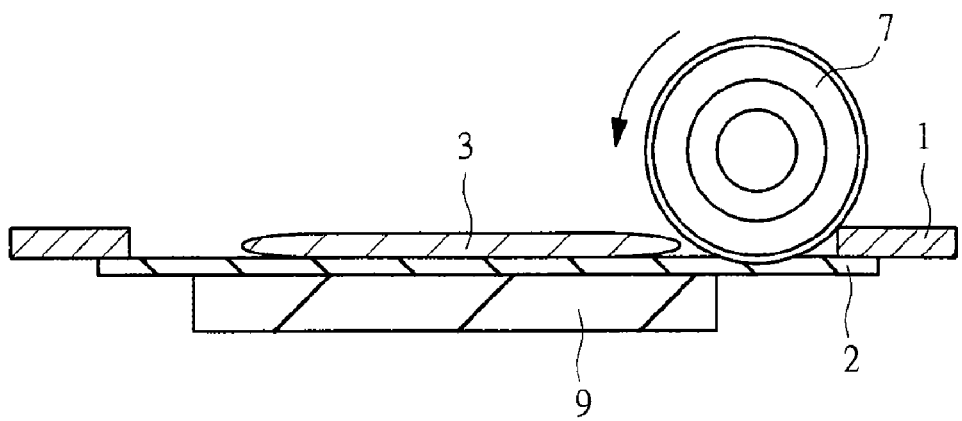
FIG. 9 is a partial cross-sectional view for describing a dicing operation.

As shown in FIG. 9, dicing starts from the outside of the semiconductor wafer 3 with the rotating blade 7. That is, also when the dicing lines 5b is formed, as with the formation of the dicing lines 4 and 5a, dicing starts from the outside of the semiconductor wafer 3.

Figure 10:
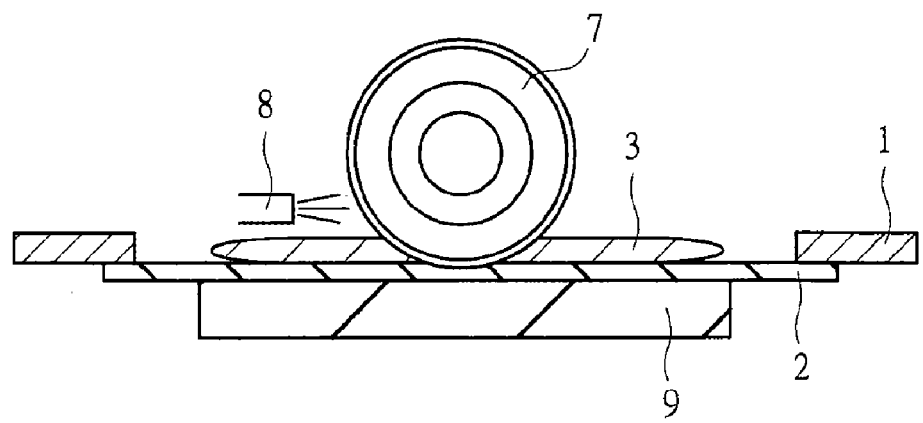
FIG. 10 is a partial cross-sectional view for describing the dicing operation continued from FIG. 9.
Figure 11:
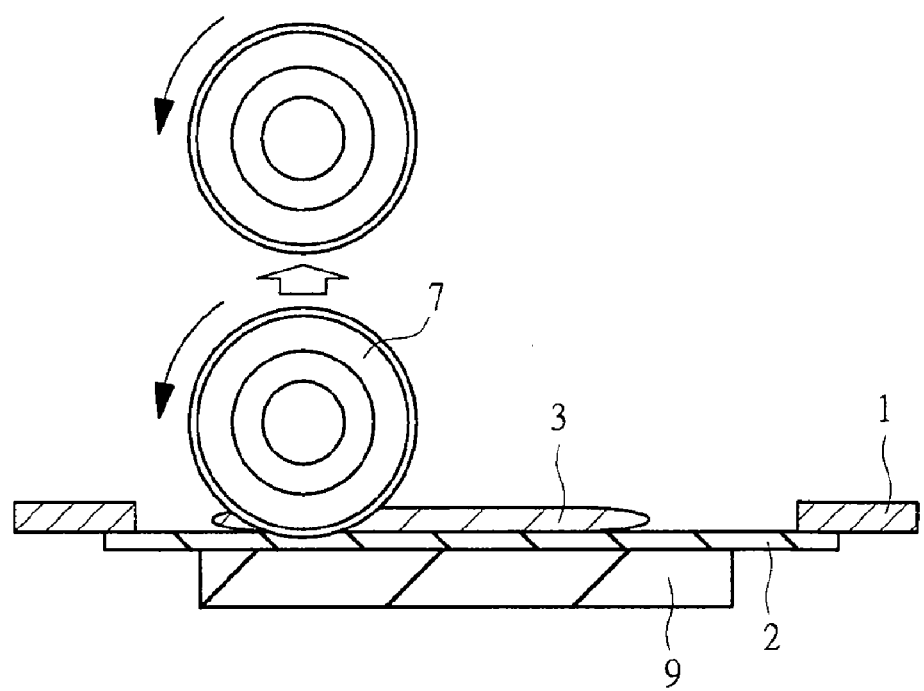
FIG. 11 is a partial cross-sectional view for describing the dicing operation continued from FIG. 10.

Next, as shown in FIG. 10, the semiconductor wafer 3 is cut off by rotating and moving the blade 7. Then, as shown in FIG. 11, dicing is ended inside the semiconductor wafer 3, and at the ending position, the blade 7 is retracted upward from the semiconductor wafer 3. By repeating this operation, the plurality of dicing lines 5b of the dicing line group in the second direction can be formed.

Here, actual dicing is performed through a step-cutting, for example. The step-cutting is to form a dicing line by dicing in two-stage. This step-cutting will be described with reference to the drawings. As described below, in the first embodiment, the case where dicing with this step-cutting is applied is described.

Figure 12:
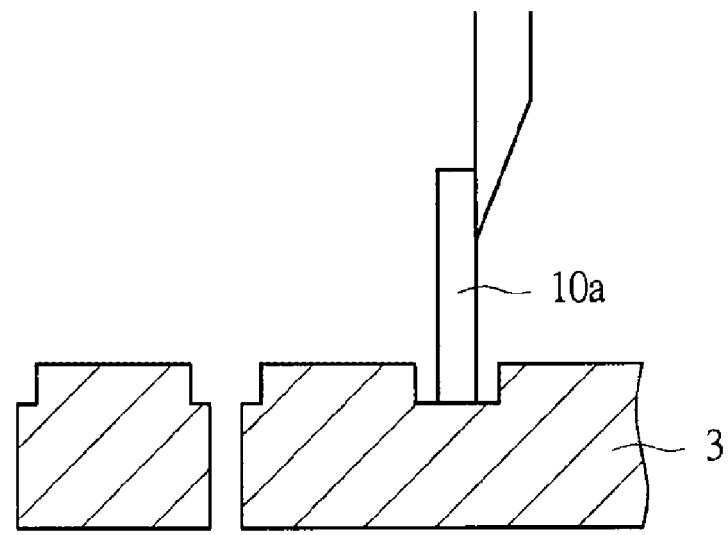
FIG. 12 is a drawing for describing a step-cutting.

First, as shown in FIG. 12, a blade 10a having a first width is used to make an incision on the semiconductor wafer 3. That is, at the first stage of dicing, the semiconductor wafer 3 is not completely cut off, but is cut partway its thickness. This first stage has a function in which TEGs (metal patterns) formed on a dicing-line formation region is completely removed with the relatively-thick blade 10a. That is, TEGs for a test in a front-end process of forming a MISFET and a multi-layer interconnection are completely removed in the dicing process as a back-end process. As a result, implementation defects can be prevented from being left.

Figure 13:
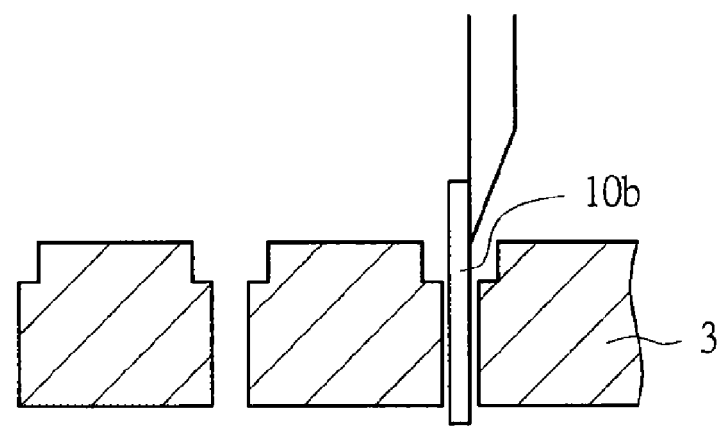
FIG. 13 is a drawing for describing the step-cutting continued from FIG. 12.

Next, as the second stage of dicing, as shown in FIG. 13, the semiconductor wafer 3 is cut off in a thickness direction, thereby forming the dicing line. A blade 10b to be used at this time has a width thinner than the first width of the blade 10a used in the first stage. TEGs are formed on the surface of the semiconductor wafer 3, and these TEGs are completely removed by the blade 10a used in the first stage. Therefore, at the second stage, there are no TEGs to be required to be removed, and only the semiconductor wafer 3 has to be cut off, so that the width of the blade 10b is thinner than the width of the blade 10a. However, the width of the blade 10b may be configured to be equal to the width of the blade 10a.

Figure 14:
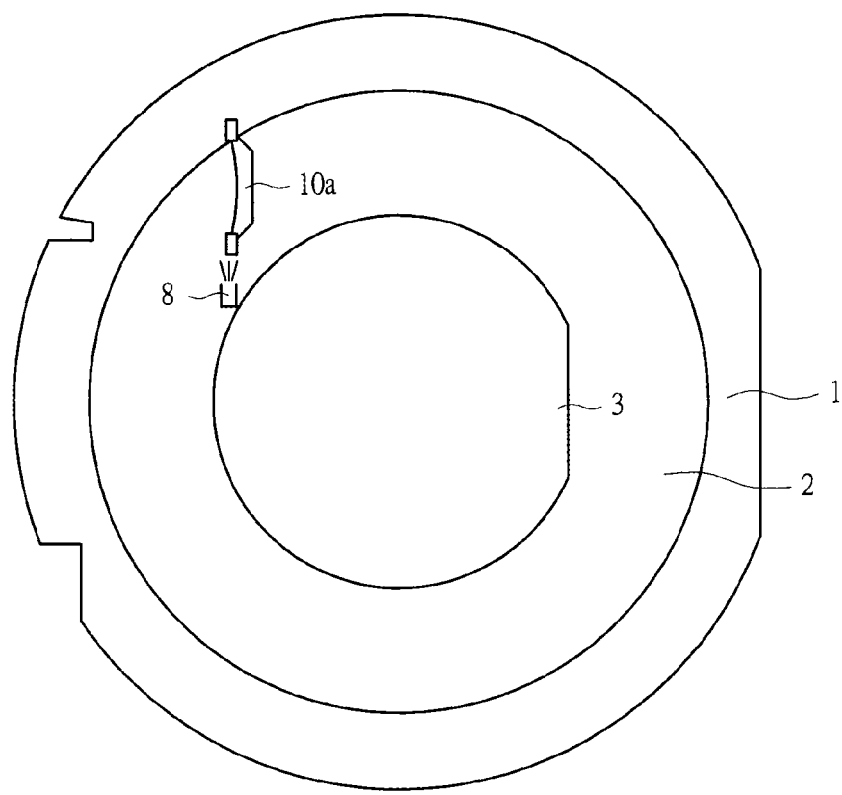
FIG. 14 is a plan view for describing a dicing operation.

Next, a method of dicing the semiconductor wafer 3 by using the above-described step-cutting according to the first embodiment will be described with reference to the drawings. First, as shown in FIG. 14, the semiconductor wafer 3 is disposed at a center portion of the dicing frame 1 to which the dicing tape 2 is attached. First, a dicing line group is formed in a direction parallel to an orientation flat formed on the semiconductor wafer 3. Therefore, the semiconductor wafer 3 is set so that an orientation of the orientation flat of the semiconductor wafer 3 is parallel to the orientation of the blade 10a.

Figure 15:
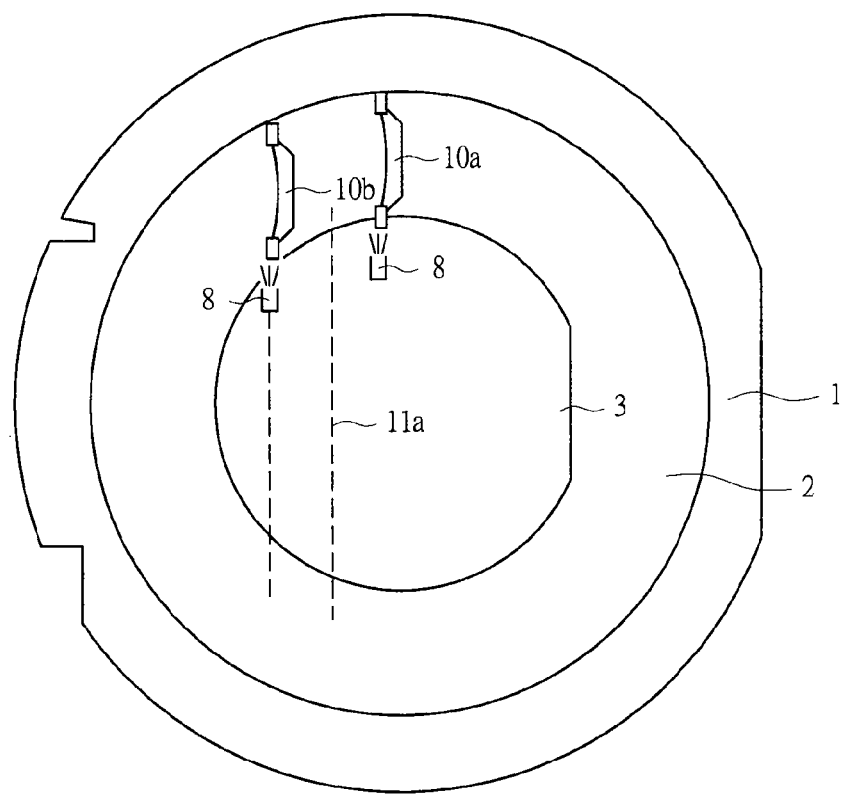
FIG. 15 is a plan view for describing the dicing operation continued from FIG. 14.
Figure 16:
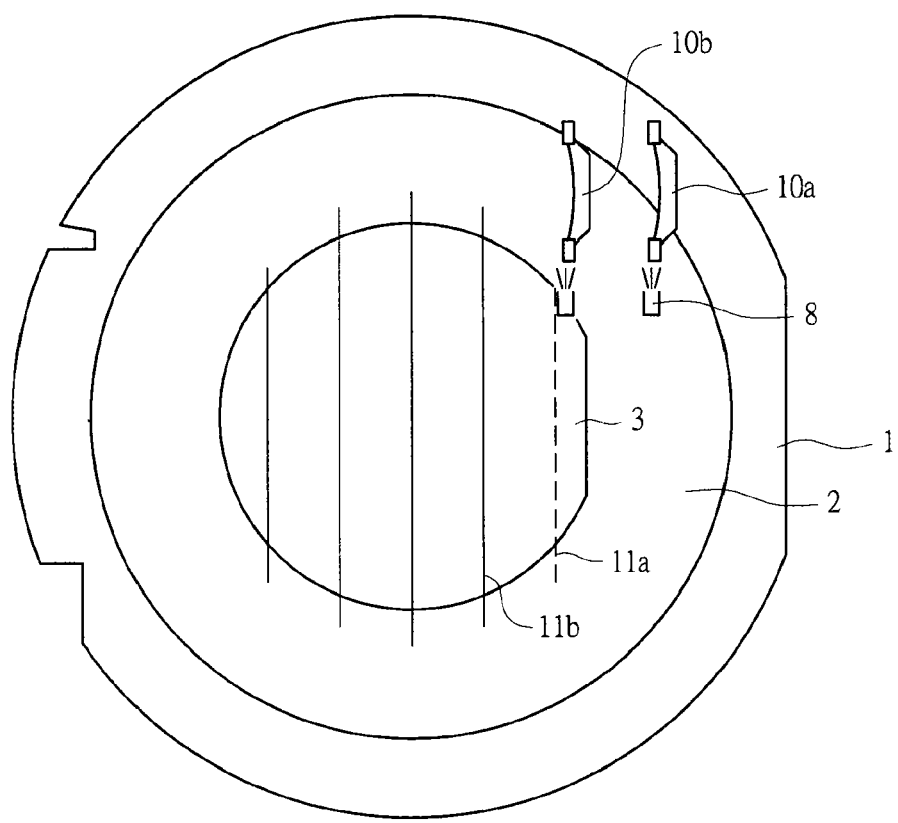
FIG. 16 is a plan view for describing the dicing operation continued from FIG. 15.

Next, as shown in FIG. 15, an incision line 11a is formed on the semiconductor wafer 3 by the blade 10a (first stage of dicing). Formation of the incision line 11a (dotted line) by the blade 10a starts from the outside of the semiconductor wafer 3, and ends outside the semiconductor wafer 3 after the incision line 11a is formed on the semiconductor wafer 3. In this manner, one incision line 11a can be formed, and the plurality of incision lines 11a can be formed by repeating the same operation. The incision lines 11a cut off partway the thickness of the semiconductor wafer 3, and should not completely cut off the semiconductor wafer 3. Here, as shown in FIG. 16, the blade 10b is disposed so as to face the blade 10a apart from each other by a predetermined distance. This blade 10b moves over the incision lines 11a formed by the blade 10a to completely cut off the semiconductor wafer 3 along the incision lines 11a (second stage of dicing). Accordingly, dicing lines 11b (solid lines) cutting off the semiconductor wafer 3 in the thickness direction can be formed. Also, formation of the dicing lines 11b starts from the outside of the semiconductor wafer 3, and ends outside the semiconductor wafer 3 after cutting off the semiconductor wafer 3. In the first embodiment, the incision lines 11a are first formed on the semiconductor wafer 3 by using the blade 10a, and then the blade 10b is used along the incision lines 11a after several lines, thereby forming the dicing lines 11b. The incision lines 11a and the dicing lines 11b are formed by having the blades 10a and 10b operating in a manner as shown in FIGS. 6 to 8.

Figure 17:
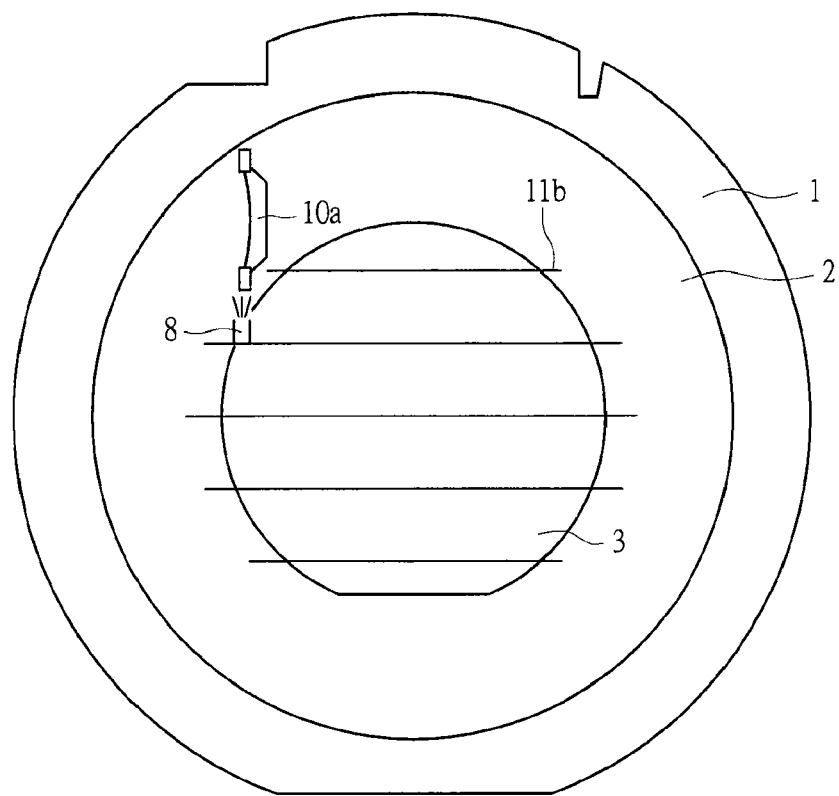
FIG. 17 is a plan view for describing the dicing operation continued from FIG. 16.
Figure 18:
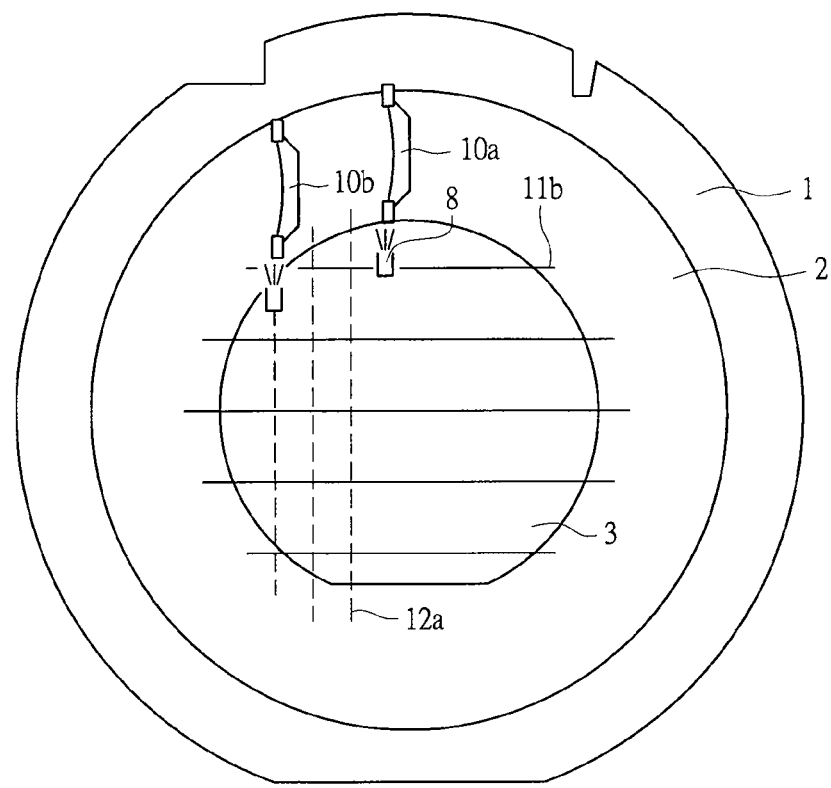
FIG. 18 is a plan view for describing the dicing operation continued from FIG. 17.

In this manner, dicing in the direction parallel to the orientation flat of the semiconductor wafer 3 is completed. Next, as shown in FIG. 17, dicing in a direction perpendicular to the orientation flat is performed after rotating a position of the semiconductor wafer 3 by 90 degrees. Also, in this case, as shown in FIG. 18, a plurality of incision lines 12a are formed by using the blade 10a. Formation of these incision lines 12a also starts from the outside of the semiconductor wafer 3, and after the incision lines 12a are formed on the semiconductor wafer 3, the formation ends outside the semiconductor wafer 3.

Figure 19:
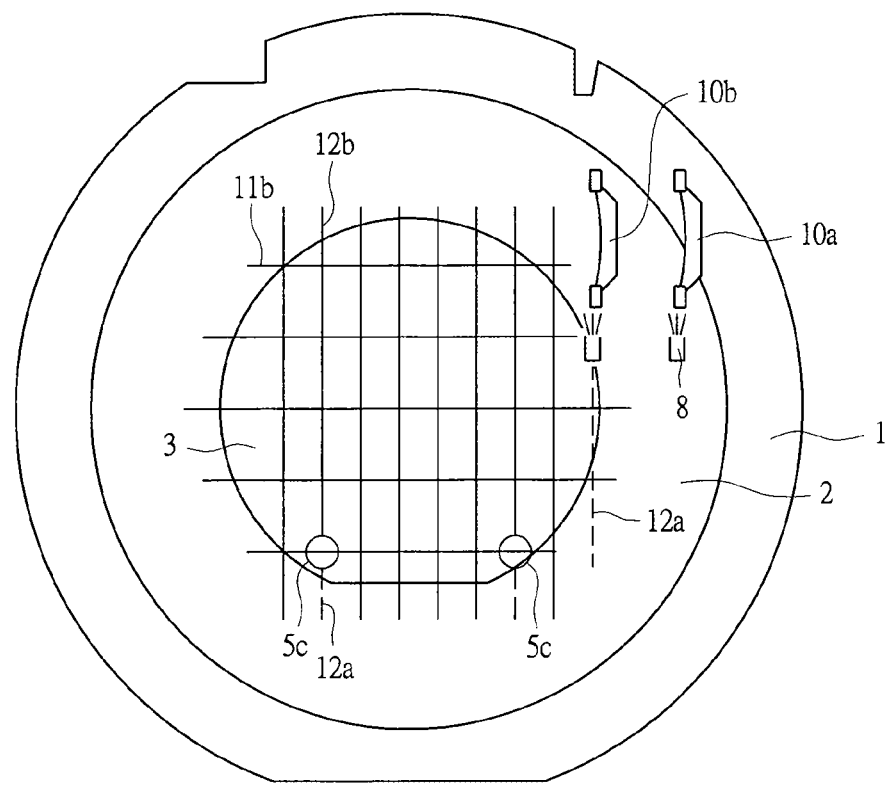
FIG. 19 is a plan view for describing the dicing operation continued from FIG. 18.

Next, as shown in FIG. 19, a plurality of dicing lines 12b are formed by using the blade 10b. Here, formation of most of the plurality of dicing lines 12b starts from the outside of the semiconductor wafer 3, and after the semiconductor wafer 3 is cut off, the formation is ended outside the semiconductor wafer 3. Therefore, most of area of the semiconductor wafer 3 is singulated into semiconductor chips by the dicing lines 11 and 12b formed vertically and horizontally. However, in part of the dicing lines 12b that may generate the scraps due to the cutting-off of the irregular-shaped outer peripheries 5c formed on the semiconductor wafer 3, the cutting-off of the semiconductor wafer 3 is ended before reaching the irregular-shaped outer peripheries 5c. That is, in the dicing lines 12b that may cause scattering of scraps due to the cutting-off of the irregular-shaped outer peripheries 5c, formation of the lines starts from the outside of the semiconductor wafer 3, and cut-off is ended inside the semiconductor wafer 3. This is one of the features of the first embodiment. That is, if the irregular-shaped outer peripheries 5c are cut off, the scraps are generated, and these scraps may be scattered due to the force of dicing. Depending on scattering directions of the scraps, the scraps may damage conforming chips formed on the semiconductor wafer. In that case, the conforming chips become defective, thereby decreasing the manufacturing yield. To get around this problem, in the first embodiment, in the dicing line 12b that may otherwise generate the scraps due to the cutting-off of the irregular-shaped outer peripheries 5c, the cutting-off of the semiconductor wafer 3 is ended before reaching the irregular-shaped outer peripheries 5c. Accordingly, the scraps are not generated, thereby preventing damages to the conforming chips due to scattering of the scraps and improving the manufacturing yield of the semiconductor chips. In addition, the incision lines 12a and the dicing lines 12b in which their cutting-off is ended outside the semiconductor wafer 3 are formed by having the blades 10a and 10b operating in the manner as shown in FIGS. 6 to 8. On the other hand, the dicing lines 12b (part of the dicing lines 12b among the plurality of dicing lines 12b) in which the cutting-off is ended before cutting off the irregular-shaped outer peripheries 5c are formed by having the blade 10b operating in a manner as shown in FIGS. 9 to 11.

Here, the incision lines 12a formed through the step-cutting are also formed on the irregular-shaped outer peripheries 5c. The reason for this is that since the incision lines 12a do not completely cut off the semiconductor wafer 3 in the thickness direction, even when the incision lines 12a are formed on the irregular-shaped outer peripheries 5c, the irregular-shaped outer peripheries 5c are not cut off by the incision lines 12a. On the other hand, the dicing lines 12b completely cut off the semiconductor wafer 3 in the thickness direction. Therefore, in the dicing lines 12b that may generate scraps, the cutting-off is ended before reaching the irregular-shaped outer peripheries 5c.

Figure 20:
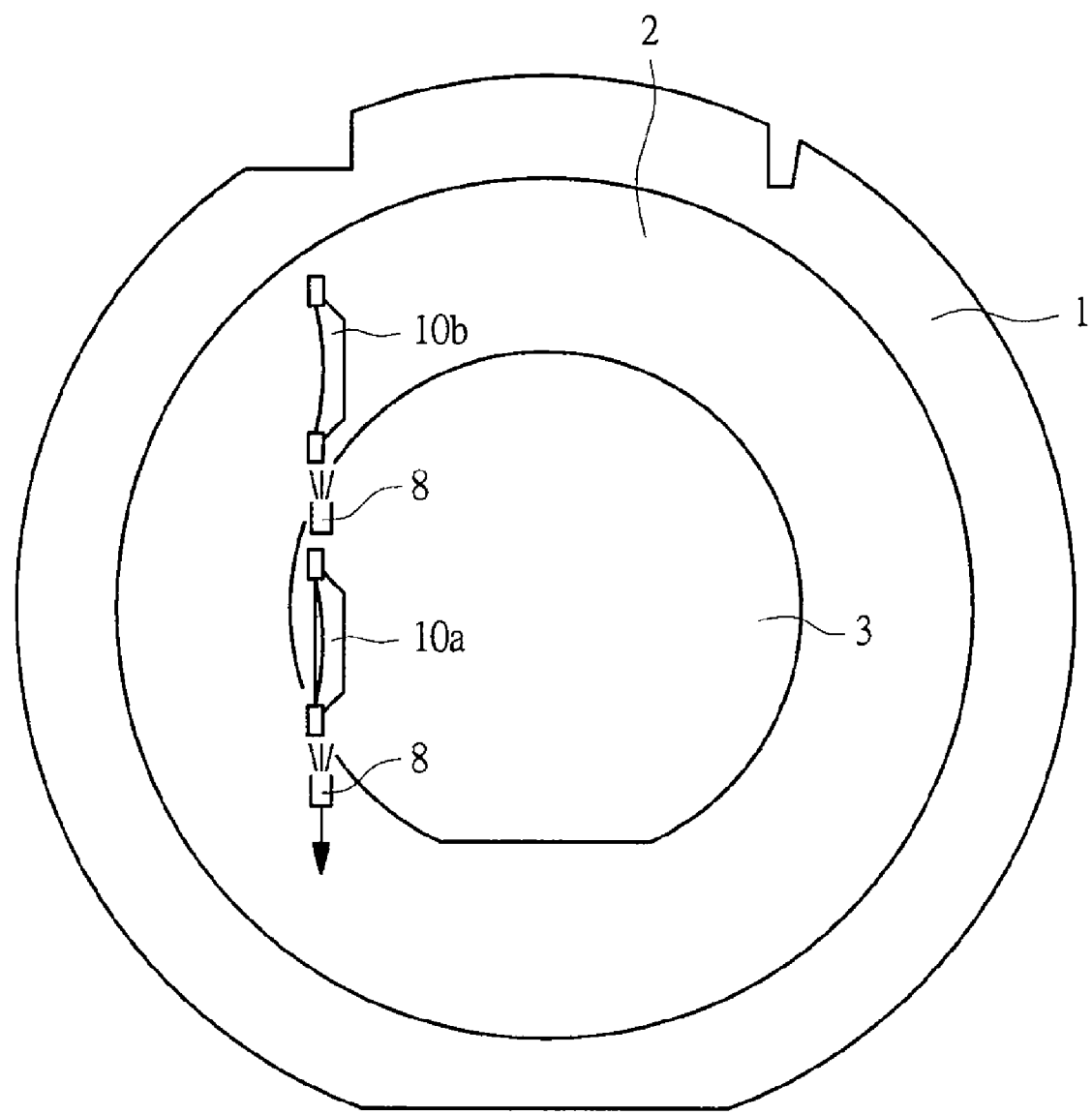
FIG. 20 is a plan view of another configuration for dicing.

In the first embodiment, as shown in FIGS. 14 to 19, dicing starts from the direction parallel to the orientation flat of the semiconductor wafer 3, and then dicing is performed in the direction perpendicular to the orientation flat. However, a dicing method according to the first embodiment is not restricted to this. For example, dicing may start from the direction perpendicular to the orientation flat, and then dicing may be performed in the direction parallel to the orientation flat. In this case, in dicing in the direction parallel to the orientation flat to be performed later, the cutting-off is ended before the dicing lines, which may generate the scraps if the irregular-shaped outer peripheries are cut off, reach the irregular-shaped outer peripheries. Furthermore, in the first embodiment, the step-cutting is performed by the blades 10a and 10b disposed in parallel to each other. However, for example, the present embodiment can also be applied to the case where the step-cutting is performed with the blades 10a and 10b disposed in series, as shown in FIG. 20.

Figure 21:
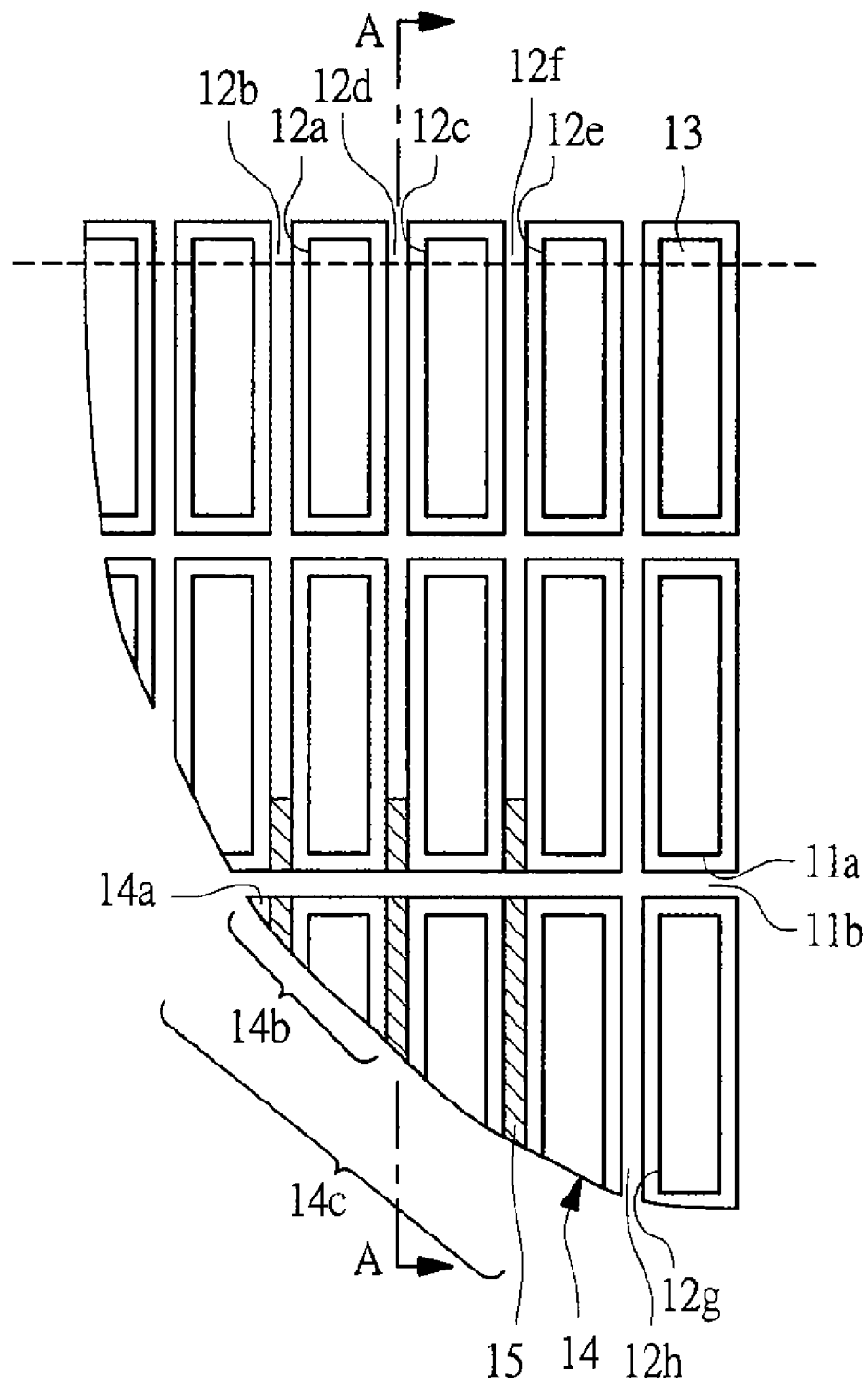
FIG. 21 is an enlarged view of a vicinity of an outer periphery of a semiconductor wafer, and the plan view of a front surface of the semiconductor wafer.

FIG. 21 is a plan view showing an example of a vicinity of an outer periphery 14 after the step-cutting is performed according to the first embodiment, and FIG. 21 shows the plan view of an element formation surface side (front surface) of the semiconductor wafer. As shown in FIG. 21, it can be seen that a semiconductor chip 13 and the outer periphery 14 are cut off by the incision lines 11a and the dicing lines 11b formed in the horizontal direction, and an incision line 12g and a dicing line 12h on the rightmost side formed in the vertical direction. On this outer periphery 14, incisions are made by three incision lines 12a, 12c, 12e. However, three dicing lines 12b, 12d, and 12f, which are corresponding to these three incision lines 12a, 12c, and 12e, end the cutting-off before reaching the outer periphery 14. As described above, since the cutting-off is not performed on the outer periphery 14 by three dicing lines 12b, 12d, and 12f, a non-cut-off portion 15 is formed. Therefore, the outer periphery 14 is not divided into further smaller areas. For example, irregular-shaped outer peripheries 14a to 14c are not cut off. That is, the irregular-shaped outer periphery 14a is not cut off by the dicing line 12b on the leftmost side, thereby preventing scattering of the scraps that are otherwise formed when the irregular-shaped outer periphery 14a is cut off. Similarly, the irregular-shaped outer periphery 14b is not cut off by the dicing line 12d, thereby preventing scattering of the scraps that are otherwise formed when the irregular-shaped outer periphery 14b is cut off by the dicing line 12d. Furthermore, the irregular-shaped outer periphery 14c is not cut off by the dicing line 12f, thereby preventing scattering of the scraps that are otherwise formed when the irregular-shaped outer periphery 14c is cut off by the dicing line 12f. On the other hand, the outer periphery 14 is cut off by the dicing line 12h, but is larger than the irregular-shaped outer peripheries 14a to 14c. Therefore, the adhesive force between the dicing tape attached onto a back surface of the semiconductor wafer and the outer periphery 14 is strong, and thus the outer periphery 14 does not come off when being diced.

Here, specific numerical values will be described. First, for example, a size of the semiconductor wafer is φ200 mm, and its thickness is from 280 μm to 550 μm in a semiconductor wafer for an LCD driver. The incision lines 11a, and the incision lines 12a, 12c, 12e, and 12g each perpendicular to the incision lines 11a, which are formed through the step-cutting, have a width of 75 μm, for example. The blades for making these incision lines have a diameter of 45 mm and a blade thickness of 60 μm to 70 μm. Also, the dicing lines 11b, and the dicing lines 12b, 12d, 12f, and 12h each perpendicular to the dicing lines 11b, which are formed through the step-cutting, have a width of 55 μm, for example. The blades for making these dicing lines have a diameter of 45 mm and a blade thickness of 45 μm to 50 μm. A size of the semiconductor chip 13 to be cut off is such that, for example, a length in a short-side direction is 1 mm and a length in a long-side direction is 12 mm. A size of the irregular-shaped outer peripheries that generate the scraps is equal to or less than approximately 2.5 mm$^2$, for example. Furthermore, a length, which is not be cut off by the dicing lines 12b, 12d, and 12f, is approximately 5 mm from an edge of the semiconductor wafer although it varies depending on the dicing lines. In the first embodiment, although the semiconductor wafer of φ200 mm is described as an example, the present embodiment can also be applied to semiconductor wafers of other sizes, such as φ150 mm and φ300 mm. For example, when the present embodiment is applied to a semiconductor wafer of φ300 mm, curvatures of the semiconductor wafers are different each other, but there is the same purpose that the irregular-shaped outer peripheries that generate the scraps and have the approximately same size as that of the semiconductor wafer of φ200 mm, should not be cut off. Furthermore, the width of the dicing lines, the blade diameter and the blade thickness, and the semiconductor chip size are similar to those in the case of the semiconductor wafer of φ200 mm.

Figure 22:
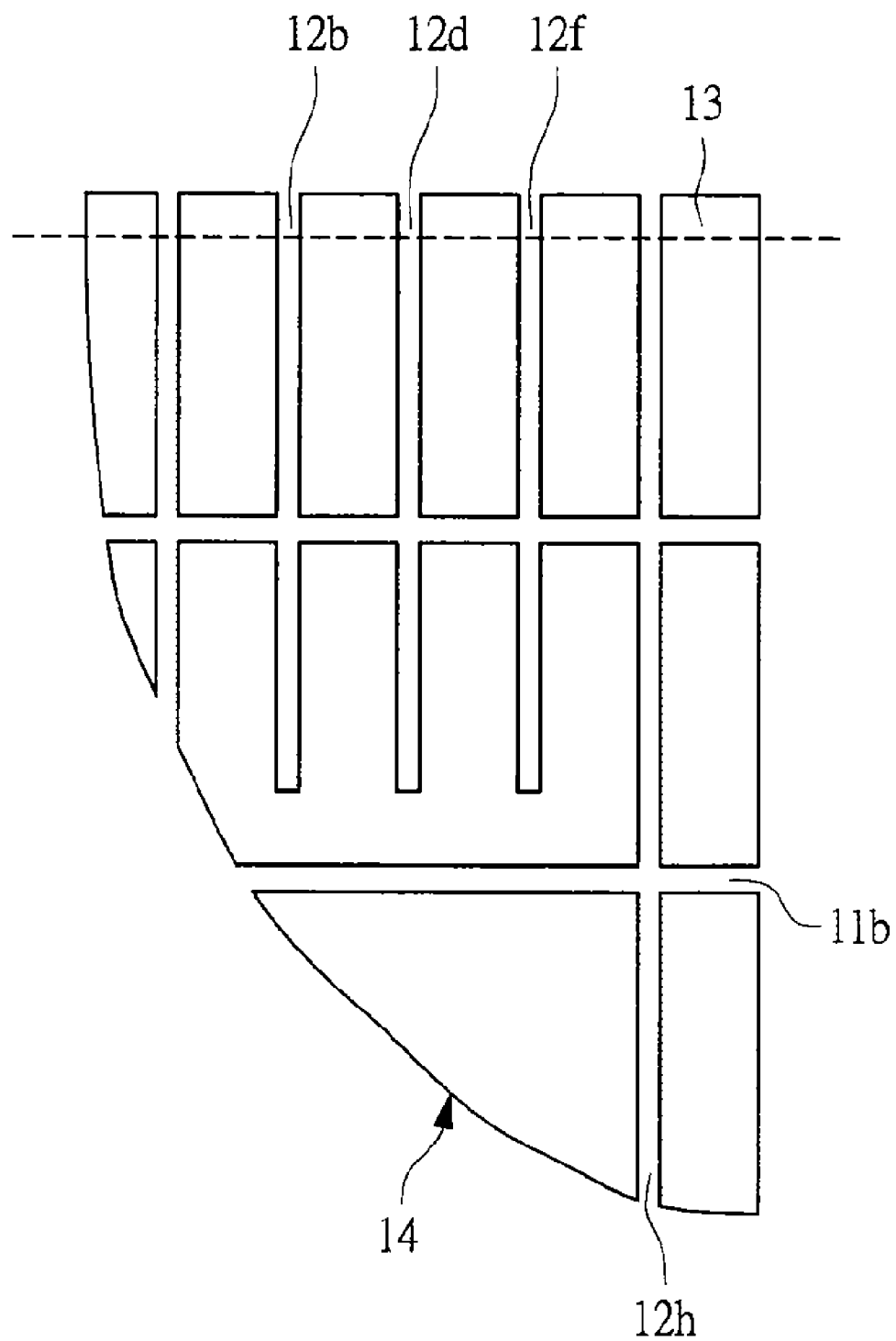
FIG. 22 is an enlarged view of a vicinity of an outer periphery of the semiconductor wafer, and the plan view of a back surface of the semiconductor wafer.

FIG. 22 is a plan view of the surface of the opposite side to the surface of FIG. 21, that is, the back surface of the semiconductor wafer. As evident from FIG. 22, the outer periphery 14 is not cut off by the dicing lines 12b, 12d, and 12f. Therefore, it can be seen that the irregular-shaped outer peripheries 14a to 14c shown in FIG. 21 are not cut off by the dicing lines 12b, 12d, and 12f. Here, FIGS. 21 and 22 show an example in which since the dicing lines 12b, 12d, and 12f does not reach the irregular-shaped outer peripheries 14a to 14c, the irregular-shaped outer peripheries 14a to 14c are not cut off. However, for example, scattering of the scraps can be prevented even when the dicing lines 12b, 12d, and 12f reach the irregular-shaped outer peripheries 14a to 14c but do not completely cut off them.

Figure 23:
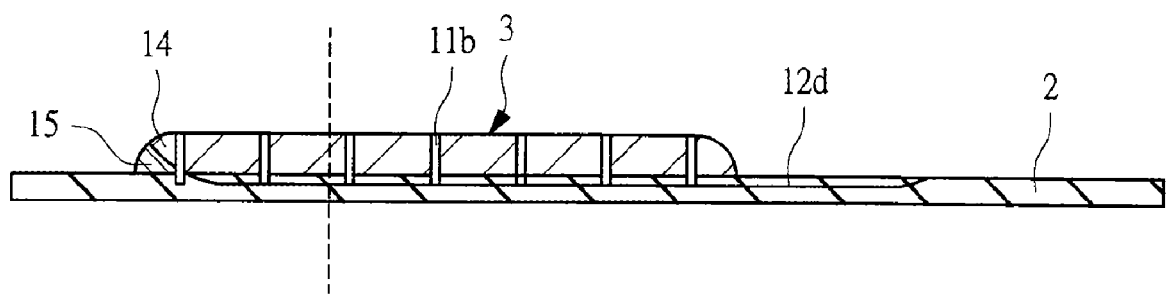
FIG. 23 is a cross-sectional view showing a cross-section taken along an A-A line in FIG. 21.
Figure 24:
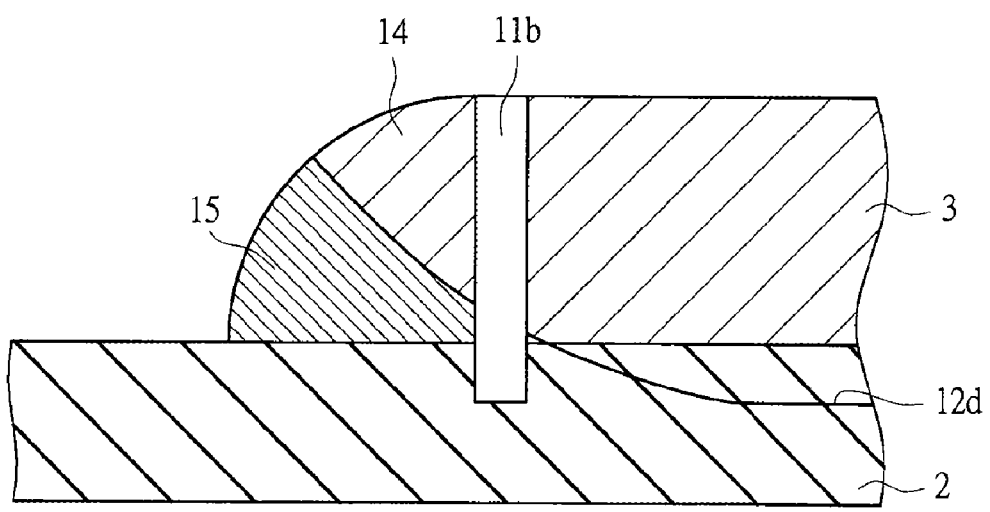
FIG. 24 is a partially-enlarged view of FIG. 23.

FIG. 23 is a cross-section view showing a cross-section taken along an A-A line in FIG. 21. FIG. 24 is a partially-enlarged view of FIG. 23. As shown in FIGS. 23 and 24, the plurality of dicing lines 11b are formed on the semiconductor wafer 3, and the dicing line 12d is formed in a direction perpendicular to the plurality of dicing lines 11b. The outer periphery 14 is not completely cut off by this dicing line 12d, and it can be seen that the not-cut off portion 15 is formed. That is, the dicing line 12d is formed so as not to cut off the outer periphery 14.

Broken lines shown in FIGS. 21 to 23 each represent a position where a blade center position is projected onto the semiconductor wafer. That is, the blade center position is stopped on the line represented by the broken line, so that the non-cut off portion 15 can be formed on the semiconductor wafer. Accordingly, scattering of the scraps due to the cutting-off of the irregular-shaped outer peripheries can be prevented.

Figure 25:
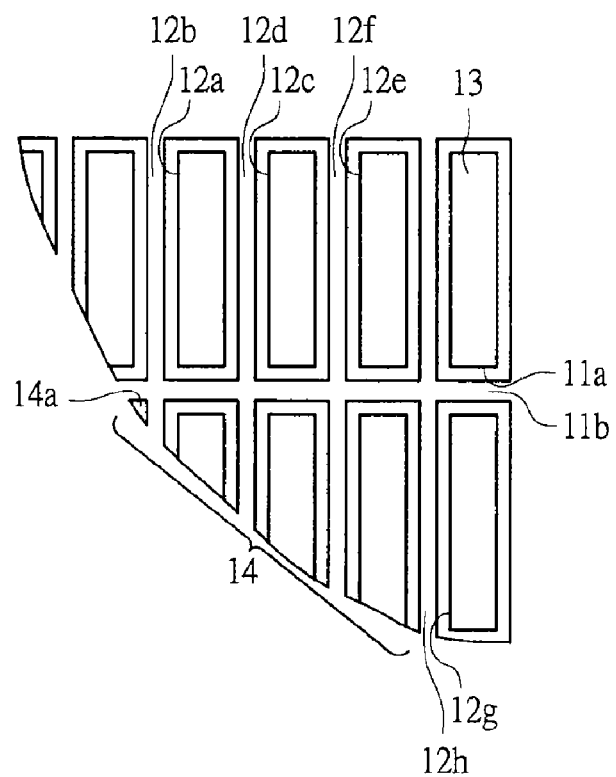
FIG. 25 is an enlarged view of a vicinity of an outer periphery of a semiconductor wafer, and the plan view of a front surface of the semiconductor wafer.
Figure 26:
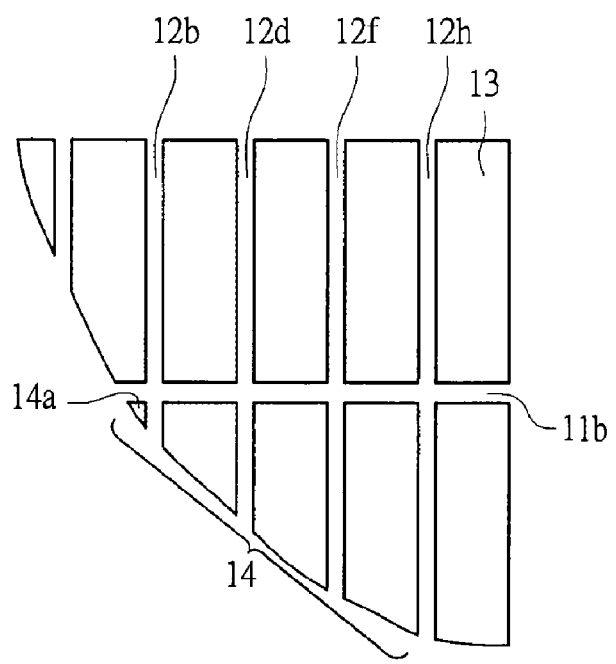
FIG. 26 is an enlarged view of a vicinity of an outer periphery of the semiconductor wafer, and the plan view of a back surface of the semiconductor wafer.

FIG. 25 is a drawing studied by the inventors, and showing the case where the outer periphery 14 is completely cut off through the step-cutting. Furthermore, FIG. 25 is a plan view of an element formation surface (front surface) side of the semiconductor wafer. FIG. 26 is a plan view of the back surface of the semiconductor wafer. As shown in FIGS. 25 and 26, the outer periphery 14 is divided by the incision lines 12a, 12c, and 12e and the dicing lines 12b, 12d, and 12f. Therefore, for example, the irregular-shaped outer periphery 14a is separated by the incision line 12a and the dicing line 12b. Since this irregular-shaped outer periphery 14a is extremely small compared with the outer periphery 14, the adhesive force between the irregular-shaped outer periphery 14a and the dicing tape is extremely weak. Thus, if the irregular-shaped outer periphery 14a is cut off by the dicing line 12b, the scrap generated by cutting off the irregular-shaped outer periphery 14a scatters from the dicing tape due to the force of cutting. If the scrap scatters, the scrap hits the conforming semiconductor chip depending on the scattering direction, and damages the conforming semiconductor chip. Accordingly, the manufacturing yield of the semiconductor chips is decreased.

Here, the inventors have studied the irregular-shaped outer peripheries formed on the semiconductor wafer and the scattering directions of the scraps occurring due to the cutting-off of the irregular-shaped outer peripheries, and as a result, the inventors have found the following facts.

Figure 27:
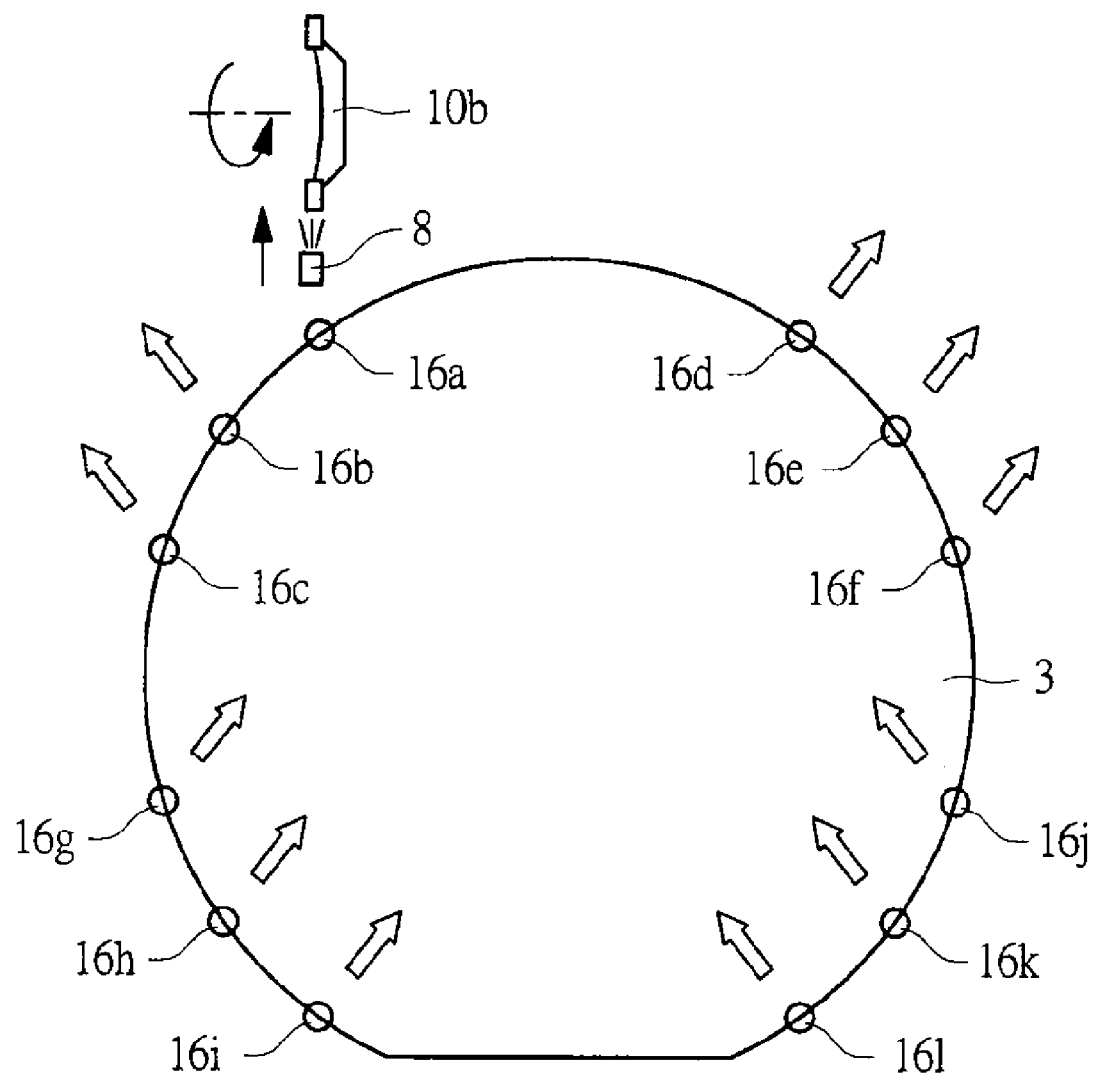
FIG. 27 is a view in which a scrap scattering direction is studied.

FIG. 27 is a view showing positions of the irregular-shaped outer peripheries formed on a semiconductor wafer, and showing the scattering directions of the scraps occurring due to the cutting-off of the irregular-shaped outer peripheries. As shown in FIG. 27, the irregular-shaped outer peripheries can be considered as being present in areas 16a to 16l. In consideration of a rotating direction of the blade 10b and a direction of cleaning-water discharged from the blade cleaning nozzle 8, it has been found that, in the irregular-shaped outer peripheries present in the areas 16a to 16f, the scattering directions of the scraps occurring at the time of the cutting-off are directed towards outside of the semiconductor wafer. Therefore, it can be known that influences of the scraps occurring in the areas 16a to 16f can be ignored. On the other hand, it has been found that in the irregular-shaped outer peripheries in the areas 16g to 16l, the scattering directions of the scraps occurring at the time of the cutting-off are directed toward inside of the semiconductor wafer, and therefore, the conforming semiconductor chips may be damaged.

From the above, the inventors have paid attention to the fact that the areas 16a to 16f which are not problematic are on a side where the blade 10b starts cutting into the semiconductor wafer and the areas 16g to 16l which are problematic are on a side where the blade 10b cuts through the semiconductor wafer. That is, among the plurality of irregular-shaped outer peripheries formed on the outer periphery of the semiconductor wafer, for the irregular-shaped outer peripheries scattering over the semiconductor wafer when being cut off, dicing is ended before cutting off the irregular-shaped outer peripheries. Also, the irregular-shaped outer peripheries scattering over the semiconductor wafer when being cut off are formed on the outer periphery of the semiconductor wafer where the blade 10b for dicing cuts through the semiconductor wafer. That is, the blade 10b is made to pass through the areas 16a to 16f which are not problematic, on the other hand, the blade 10b is made not to cut off the areas 16g to 16l which are problematic. In other words, in formation of the dicing lines by the blade 10b, the processing (dicing) starts from the outside of the semiconductor wafer to cut off the semiconductor wafer in the thickness direction. At this time, the areas 16a to 16f are also cut off, but there is no problem because the scattering directions of the scraps occurring due to the cutting-off are directed toward the outside of the semiconductor wafer. Subsequently, the cutting-off of the semiconductor wafer continues, and before reaching the areas 16g to 16l, the formation of the dicing lines is ended. As a result, the scraps generated if the irregular-shaped outer peripheries are cut off can be prevented from being scattered over the semiconductor wafer.

One feature of the first embodiment is that, in formation of part of the plurality of dicing lines, dicing starts from the outside of the semiconductor wafer, and after cutting off most part of the semiconductor wafer, dicing is ended before reaching the irregular-shaped outer peripheries on a side where the blade cuts through the wafer. Accordingly, the scraps that would otherwise scatter over the semiconductor wafer are not generated by not cutting off the irregular-shaped outer peripheries. Therefore, the scraps do not damage the conforming semiconductor chips, so that the manufacturing yield of the semiconductor chips can be improved.

Also, since dicing starts from the outside of the semiconductor wafer, the blade can be prevented from being damaged. For example, since the irregular-shaped outer peripheries are also present in the areas 16a to 16f on the side where the blade 10b cuts into the wafer, the scraps are generated by cutting off these areas of 16a to 16f. However, it may be thought that the scraps should be prevented from being generated. In this case, the blade 10b is not started from the outside of the semiconductor wafer but has to start from a partway position on the semiconductor wafer so as not to cut off the areas 16a to 16f. However, when dicing starts from the partway position on the semiconductor wafer, a cutting load on the blade 10b becomes large, so that it is problematic that the blade 10b is damaged and therefore cannot perform dicing. Even when the blade 10b is not damaged, a shift of the dicing line for the cutting-off or meandering of the blade 10b may occur, thereby making impossible to correctly cut off. Concerning this point, in the first embodiment, it has been found that the irregular-shaped outer peripheries present on the side where the blade 10 cuts into the wafer are not problematic. Therefore, formation of the dicing lines by the blade 10b can be performed from the outside of the semiconductor wafer instead of being performed from the partway position on the semiconductor wafer. Thus, the damage to the blade, and the shift of the dicing lines can be prevented.

Furthermore, in the formation of part of the plurality of dicing lines, dicing starts from the outside of the semiconductor wafer, and after cutting off most part of the semiconductor wafer, dicing is ended before reaching the irregular-shaped outer peripheries on the side where the blade cut through the wafer. Therefore, compared with the case where all of the plurality of dicing lines are formed to the outside of the semiconductor wafer, a dicing distance can be shortened. Thus, throughput in the dicing process can be improved.

Still further, the scraps can be prevented from scattering. Therefore, it is possible to reduce damages of the blade caused by the scraps scattering sticking into the blade or hitting the blade, thereby reducing costs required for the blade. Still further, the number of blade replacements due to damage can be reduced, thereby saving time required for replacement. Furthermore, since the cutting edge of the blade immediately after replacement of the damaged blade cannot be adjusted (setting diamond particles or adjusting roundness), chipping (chipping of silicon) of the semiconductor chips singulated by dicing is worsened. However, according to the first embodiment, the damage of the blade itself can be reduced, thereby preventing chipping being worsened in the semiconductor chips. In this manner, since chipping of the semiconductor chips is not worsened, flexural strength of the semiconductor chips can be ensured, and yield of the semiconductor chips can be improved.

Figure 28:
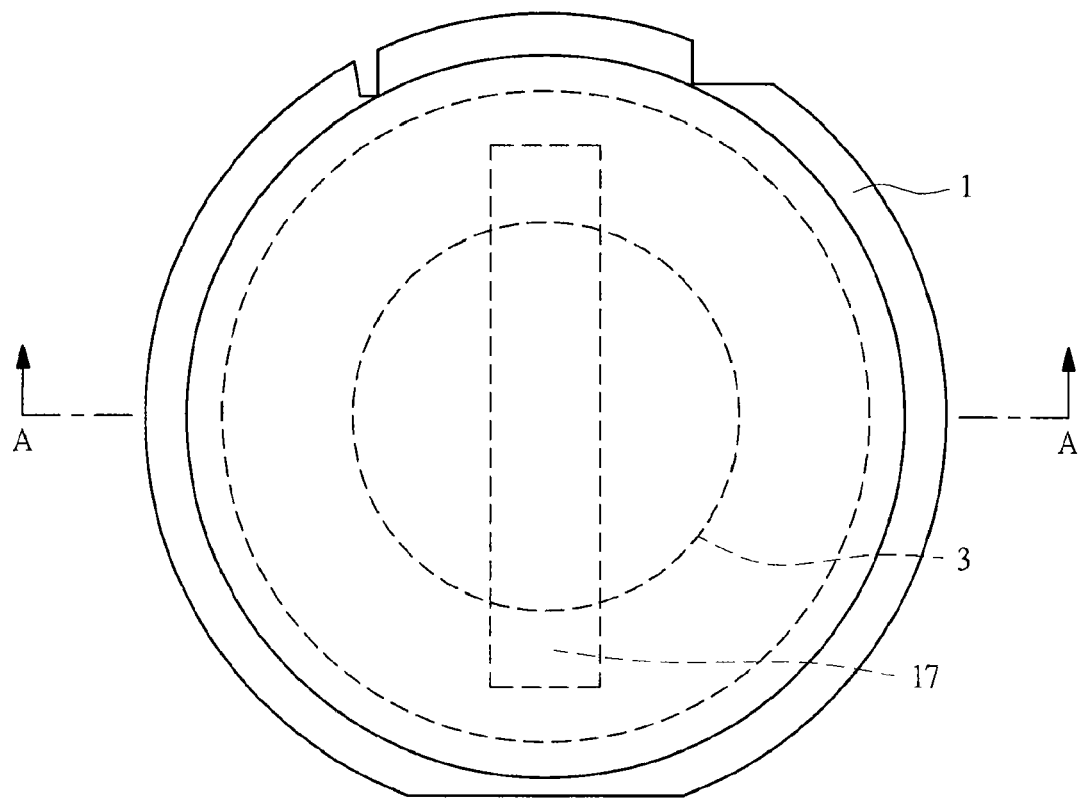
FIG. 28 is a plan view of a step of irradiating a semiconductor wafer with ultraviolet rays.
Figure 29:
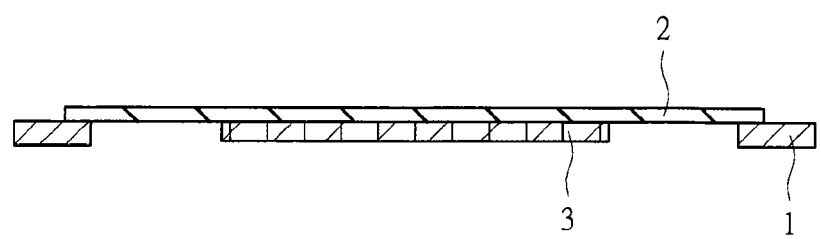
FIG. 29 is a cross-section view showing a cross-section taken along an A-A line in FIG. 28.
Figure 29:
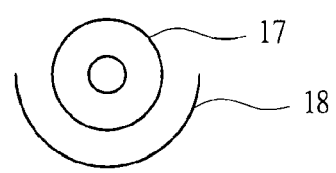

Through above manner, the dicing process according to the first embodiment is completed. Next, processes after the completion of the dicing process will be described with reference to the drawings. FIG. 28 is a drawing showing a state where the semiconductor wafer 3 fixed to the dicing frame 1 is irradiated with ultraviolet rays by an ultraviolet-ray lamp 17. FIG. 29 is a cross-section view showing a cross-section taken along an A-A line in FIG. 28. As shown in FIG. 29, the semiconductor wafer 3 attached to the dicing tape 2 is disposed so as to face the ultraviolet-ray lamp 17. Then, the ultraviolet rays are emitted from the ultraviolet-ray lamp 17 by operating the ultraviolet-ray lamp 17. A reflective plate 18 is provided under the ultraviolet-ray lamp 17, and the reflective plate 18 is configured to allow the ultraviolet rays emitted from the ultraviolet-ray lamp 17 to effectively irradiate the semiconductor wafer 3. When the semiconductor wafer 3 is irradiated with the ultraviolet rays, the adhesive force of the dicing tape 2 attached to the semiconductor wafer 3 is decreased. A purpose of decreasing the adhesive force of the dicing tape 2 by irradiation of the ultraviolet rays in this manner is to easily pick up semiconductor chips singulated by dicing.

Figure 30:
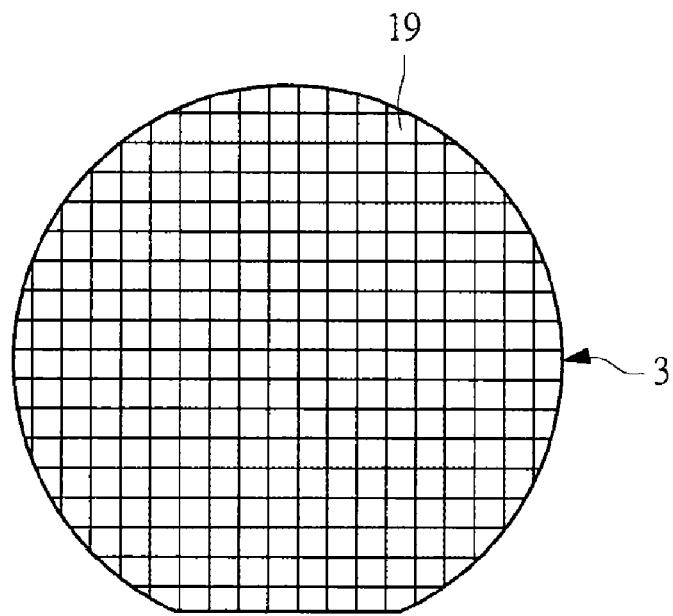
FIG. 30 is a plan view showing a semiconductor wafer.
Figure 31:
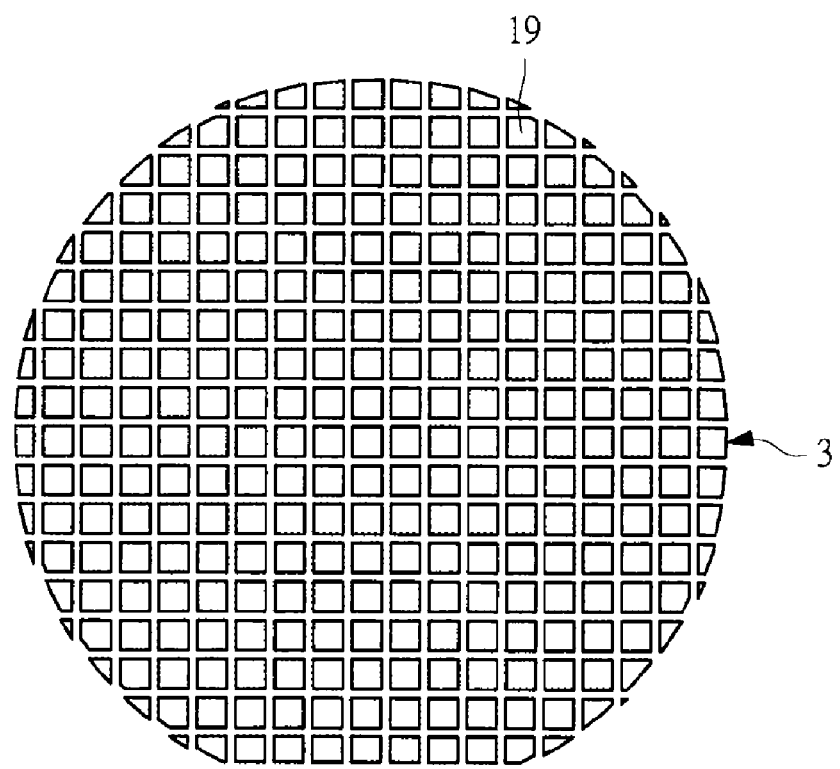
FIG. 31 is a plan view showing a semiconductor wafer in which widths of dicing lines are expanded.

Next, as shown in FIG. 30, dicing lines are vertically and horizontally formed by dicing. The semiconductor wafer 3, which has a plurality of semiconductor chips 19 that are cut and singulated by these dicing lines, is formed. Then, as shown in FIG. 31, a interval between individually-cut-off semiconductor chips is widened to separate the chips by expanding a width of the plurality of dicing lines formed on the semiconductor wafer 3, thereby allowing each semiconductor chip 19 to be easily picked up. A tension force is applied to the dicing tape to which the semiconductor wafer 3 is attached in order to expand the width of the dicing lines. This dicing-line-width expanding process is performed in order to expand the interval between adjacent semiconductor chips 19. A reason for widening the width between the semiconductor chips 19 is to prevent chipping and flaws around the semiconductor chips due to contact with the adjacent semiconductor chips 19 each other at the time of pickup.

Figure 32:
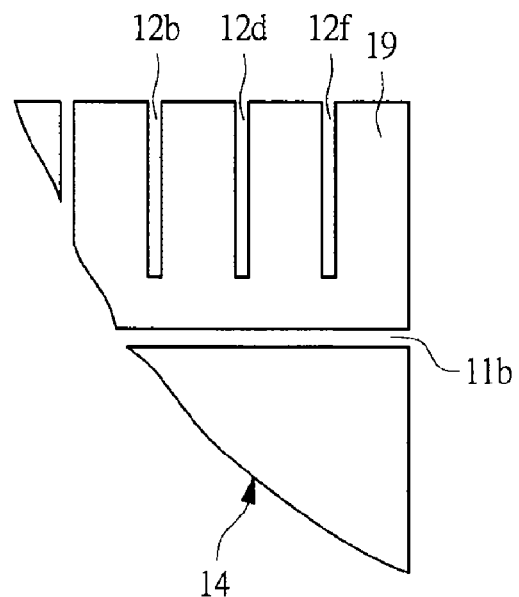
FIG. 32 is an enlarged view of a vicinity of an outer periphery of the semiconductor wafer, and the plan view of a back surface of the semiconductor wafer.
Figure 33:
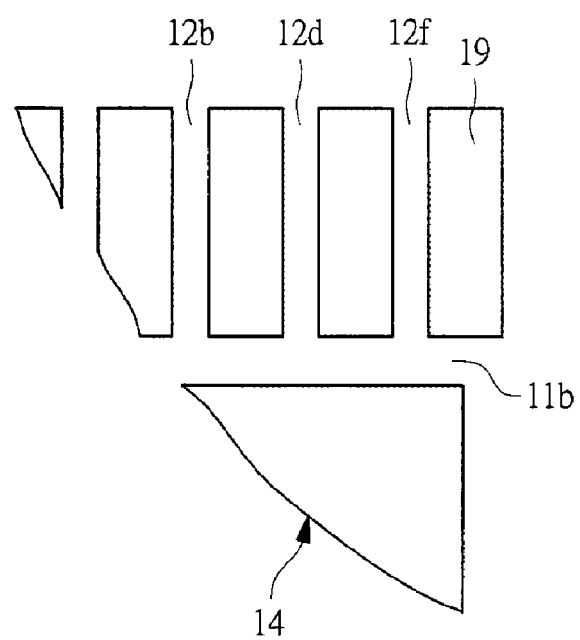
FIG. 33 is an enlarged view of the vicinity of the outer periphery of the semiconductor wafer in which the widths of the dicing lines are expanded, and the plan view of the back surface of the semiconductor wafer.

FIG. 32 is a plan view showing a vicinity of the outer periphery 14 of the semiconductor wafer 3. Also, FIG. 32 is a plan view of a back surface opposite to the element formation surface (front surface) of the semiconductor wafer. As shown in FIG. 32, in the dicing process according to the first embodiment, the dicing lines 12b, 12d, and 12f do not reach the outer periphery 14. Therefore, the irregular-shaped outer peripheries existing in the outer periphery 14 are not cut off by the dicing lines 12b, 12d, and 12f, thereby preventing scattering of the scraps. When the width of the dicing lines is expanded from this state, the state becomes as shown in FIG. 33. FIG. 33 is a plane view showing a state where the width of the dicing lines 11b, 12b, 12d, and 12f formed on the semiconductor wafer 3 is expanded by applying the tension force to the dicing tape. As evident from FIG. 33, a non-cut-off portion, which is formed between the dicing lines 12b, 12d, and 12f and the dicing line 11b perpendicular thereto, is divided by the tension force of the dicing tape, and accordingly is singulated into individual semiconductor chips 19 (completely separated). In this manner, it can be found that, even when the dicing lines 12b, 12d, and 12f in which the cut-off is ended inside the semiconductor wafer 3 are formed, the non-cut-off portion is divided and the interval is expanded in the dicing-line-width expanding process, whereby the semiconductor chips 19 are singulated and the widths of the dicing lines 12b, 12d, and 12f are normally and uniformly expanded. Therefore, when a normally-shaped semiconductor chip 19 is picked up, the adjacent semiconductor chips 19 can be prevented from making contact with each other. On the other hand, since the outer periphery 14 is not cut off by the dicing lines, it is not expanded. However, this poses no problems since the outer periphery is different from the conforming semiconductor chips 19.

Here, in the dicing-line-width expanding process, after the non-cut-off portion is divided, the interval is widened. However, when the non-cut-off portion is divided, it is considered whether fragments are scattered and damage the surface of the semiconductor 19. However, in the first embodiment, the step-cutting is performed. Therefore, the incision lines are formed on the surface of the semiconductor wafer 3, and accordingly the non-cut-off portion is present inside grooves formed by the incision lines. That is, the non-cut-off portion is not exposed on the front surface side of the semiconductor wafer 3, but is formed on the back surface side. Therefore, even when the non-cut-off portion is divided in the dicing-line-width expanding process, the fragments, which are generated when the non-cut-off portion is divided, are not scattered over the front surface of the semiconductor chips 19, but are scattered toward the back surface side. For this reason, in the dicing-line-width expanding process, the fragments which are generated due to division of the non-cut-off portion are not scattered over the front surface of the semiconductor chips 19, and therefore do not damage the front surface of the semiconductor chips 19.

Incidentally, there is a technology in which dicing is started from an inside of the semiconductor wafer and dicing is ended inside the semiconductor wafer over the entire semiconductor wafer. That is, this technology is to dice the semiconductor wafer without cutting off its entire outer periphery. With this technology, scattering of the scraps occurring due to the cutting-off of the irregular-shaped outer peripheries also can be prevented. However, since the dicing lines are not formed over the entire outer periphery, the widths of the dicing lines existing near the outer periphery cannot be uniformly expanded in the dicing-width expanding process. Therefore, a semiconductor chip cannot be picked up without making contact with the adjacent semiconductor chip. If the dicing lines are forcibly expanded to cause splits on the outer periphery where no dicing line is formed, broken fragments (silicon fragments) may be scattered over the front surface of the conforming semiconductor chips and damage them. In particular, in the case of a single-cutting for forming the dicing lines at one step, there is a high possibility of scattering of the broken fragments over the front surface of the semiconductor chips.

Furthermore, there is a technology of alternately providing two types of dicing lines, that is, a dicing line in which dicing starts from the outside of the semiconductor wafer and is ended outside the semiconductor wafer after the semiconductor wafer is cut off, and a dicing line in which dicing starts from the inside of the semiconductor wafer and is ended inside the semiconductor wafer. With this technology, when the semiconductor chips to be singulated are large, as with the above-described technology, the widths of the dicing lines existing near the outer periphery also cannot be uniformly expanded in the dicing-width expanding process. Therefore, a semiconductor chip cannot be picked up without making contact with the adjacent semiconductor chip. If the dicing lines are forcibly expanded to cause splits on the outer periphery where no dicing line is formed, broken fragments (silicon fragments) may be scattered over the front surface of the conforming semiconductor chips and damage them. On the other hand, when the semiconductor chips to be singulated are small, it seems that the widths of the dicing lines can be expanded in the dicing-width expanding process. However, in the case of the single-cutting, when a split occurs on the outer periphery where no dicing line is formed, broken fragments (silicon fragments) may be scattered over the front surface of the conforming semiconductor chips and damage them. Also, when the semiconductor chips to be singulated are small, the diameter of the blade for use in dicing has to be small. However, when the diameter of the blade is small, throughput is decreased, and therefore the number of rotations of the blade has to be increased, thereby making application difficult.

Figure 34:
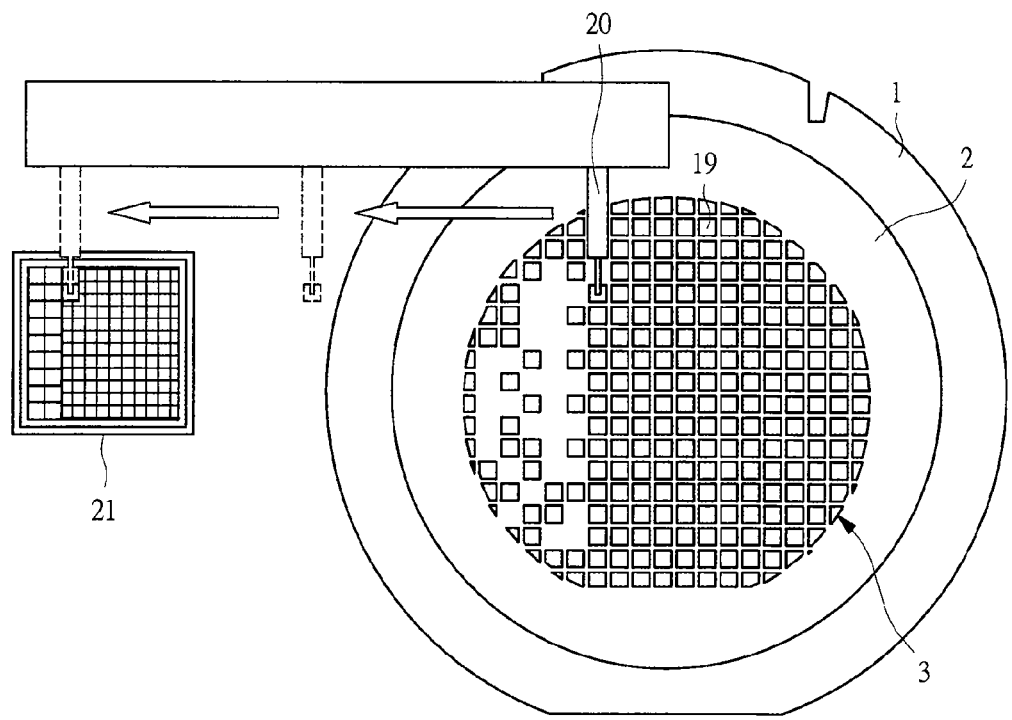
FIG. 34 is a drawing showing a state where a semiconductor chip is picked up.

Next, when the dicing-line-width expanding process is completed, the singulated semiconductor chips are picked up to be accommodated in a container. FIG. 34 is a drawing showing a state where the semiconductor chips 19 obtained by singulation of the semiconductor wafer 3 are picked up and accommodated in a container 21. As shown in FIG. 34, among the singulated semiconductor chips 19, conforming ones are picked up by a pick-up collet 20. The conforming semiconductor chips 19 are accommodated in the container 21 by moving this pick-up collet 20 with a moving mechanism.

Figure 35:
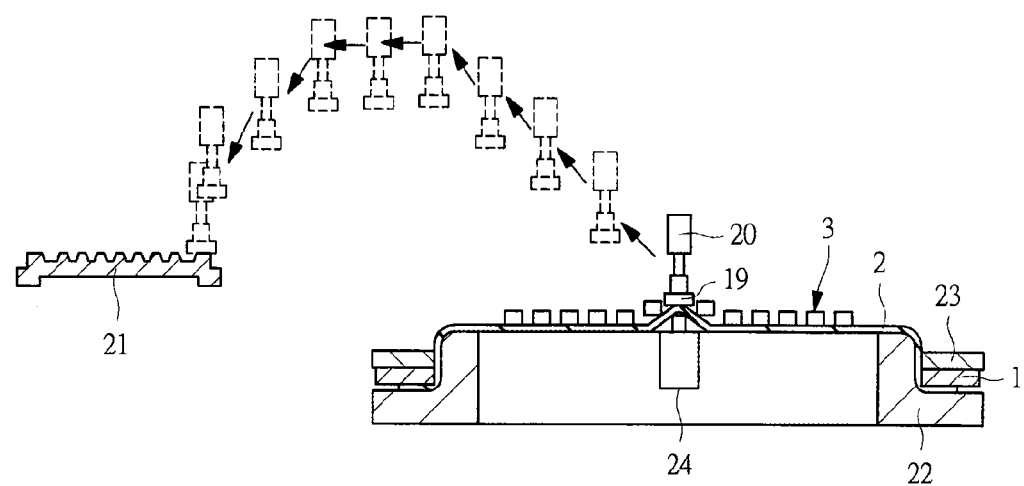
FIG. 35 is a drawing of showing a state where a semiconductor chip is picked up.

FIG. 35 is a partial cross-section view showing a state where the semiconductor chip 19 is picked up. In FIG. 35, the dicing frame 1 is disposed over an extension stage 22, and the dicing frame 1 is fixed by an extension ring 23 from above. At this time, since the dicing tape 2 attached to the dicing frame 1 is expanded, the dicing-line width of the semiconductor wafer 3 formed on the dicing tape 2 can be expanded. Next, the semiconductor chip 19 is thrust with a chip thrusting pin 24. At this time, since the dicing-line width is expanded, the semiconductor chip 19 is prevented from making contact with the adjacent semiconductor chip 19. Therefore, chipping and flaws around the semiconductor chips 19 can be prevented. Then, the semiconductor chip 19 that is thrust is moved as being held by the pick-up collet 20 to be accommodated in the container 21.

Finally, a visual inspection is performed to the semiconductor chips 19 accommodated in the container, and then the semiconductor chips 19 are packed and shipped. In the above-described manner, the semiconductor devices for use in an LCD driver can be fabricated.

Figure 36:
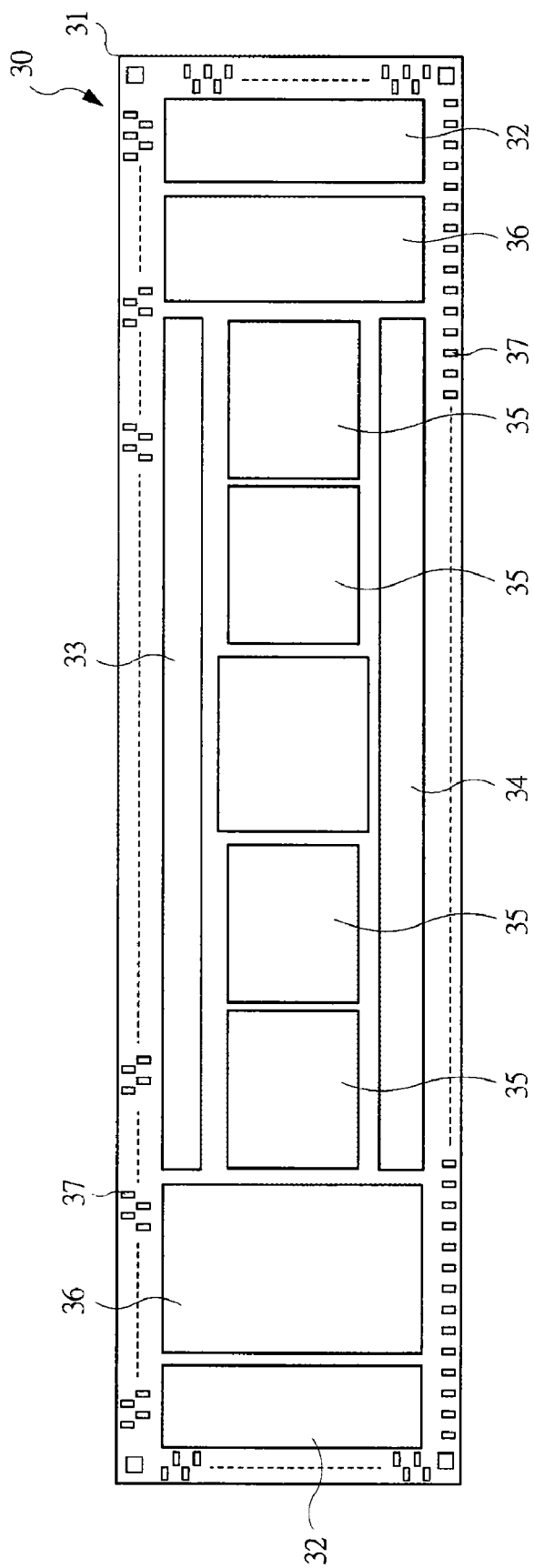
FIG. 36 is a plan view showing a semiconductor chip for an LCD driver.

Next, the semiconductor chips for an LCD driver formed through the above-described processes will be described. FIG. 36 is a plan view showing a configuration of a semiconductor chip 30 (semiconductor device) according to the first embodiment. The semiconductor chip 30 according to the first embodiment is a driver for an LCD. In FIG. 36, the semiconductor chip 30 has, for example, a semiconductor substrate 31 formed in an elongated rectangular shape and on its main surface, for example, a driver for an LCD for driving a liquid-crystal display device is formed. This LCD driver has a function of controlling the orientation of liquid-crystal molecules by supplying voltages to each pixel of a cell array constituting the LCD, and includes a gate driving circuit 32, a source driving circuit 33, a liquid-crystal driving circuit 34, a graphic RAM (Random Access Memory) 35, and a peripheral circuit 36.

Near the outer periphery of the semiconductor chip 30, a plurality of bump electrodes 37 are disposed with a predetermined distance along the outer periphery of the semiconductor chip 30. These bump electrodes 37 are disposed on an active region where elements and interconnections of the semiconductor chips 30 are disposed. Among the plurality of bump electrodes 37, there are bump electrodes for an integrated circuit required for a configuration of the integrated circuit and dummy bump electrodes not required for the configuration of the integrate circuit. Near one of long sides and two short sides of the semiconductor chip 30, the bump electrodes 37 are disposed in a staggered manner. The plurality of bump electrodes 37 disposed in the staggered manner are bump electrodes mainly for gate output signals or source output signals. The bump electrodes 37 arranged in the staggered manner at a center of the long side of the semiconductor chip 30 are the bump electrodes for source output signals, and the bump electrodes 37 arranged in the staggered manner near both corners of the long side of the semiconductor chip 30 and on both short sides of the semiconductor chip 30 are bump electrodes for gate output signals. By adopting such a staggered arrangement, many necessary bump electrodes for gate output signals and bump electrodes for source output signals can be disposed while an increase in a size of the semiconductor chip 30 is suppressed. That is, the number of the bump electrodes can be increased while the chip size is reduced.

Also, near the other long side of the semiconductor chip 30, the bump electrodes 37 are disposed in a straight line instead of the staggered manner. These bump electrodes 37 disposed so as to be arranged in the straight line are bump electrodes for digital input signals or analog input signals. Furthermore, near four corners of the semiconductor chips 30, dummy bump electrodes are formed. Here, in FIG. 36, the example has been described that the bump electrodes 37 for the gate output signals or source output signals are disposed in the staggered arrangement and the bump electrodes 37 for the digital input signals or analog input signals are disposed in the straight line. However, the bump electrodes 37 for the gate output signals or source output signals may be disposed in the straight line, and the bump electrodes 37 for the digital input signals or analog input signals may be disposed in the staggered arrangement.

An outer dimension of the semiconductor chip 30 is such that, for example, a length in a short-side direction is 1.0 mm and a length in a long-side direction is 12.0 mm, or the length in the short-side direction is 1.0 mm and the length in the long-side direction is 10.0 mm, or furthermore the length in the short-side direction is 2.0 mm and the length in the long-side direction is 20.0 mm. In this manner, the semiconductor chip 30 for use in an LCD driver has a rectangular shape. Specifically, in many cases, a ratio of the length of the short side to the length of the long side is 1:8 to 1:12. Furthermore, the length in the long-side direction is equal to or longer than 5 mm.

As described above, the semiconductor chip 30 for an LCD driver has a rectangular shape. When the above-shaped semiconductor chip 30 is obtained from the semiconductor wafer, in particular, dicing lines for cutting off a shorter length in the short-side direction are densely disposed. Therefore, scattering of the scraps occurring due to the cutting-off of the irregular-shaped outer peripheries tends to be problematic. However, according to the first embodiment, in the dicing lines that might generate the scraps due to the cutting-off of the irregular-shaped outer peripheries among the plurality of dicing lines, the cutting-off is ended before cutting off the irregular-shaped outer peripheries. Therefore, scattering of the scraps over the semiconductor wafer can be prevented. In particular, in a process of dicing the semiconductor chip 30 for an LCD driver having a shorter length in the short-side direction, the dicing method according to the first embodiment achieves a significant effect.

Figure 37:
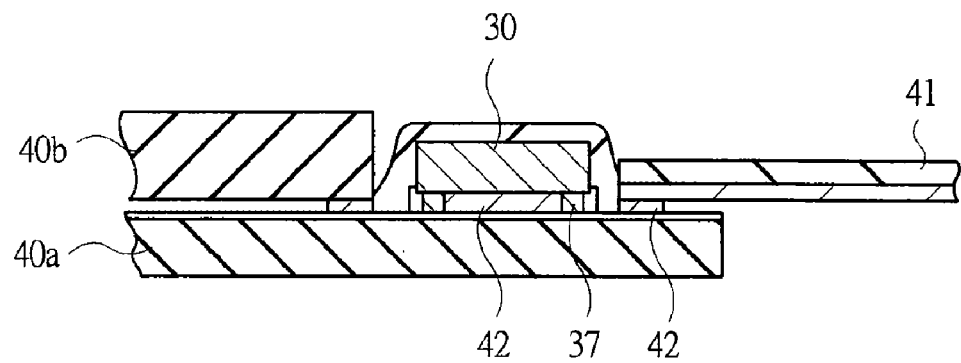
FIG. 37 is a cross-sectional view showing a state where a semiconductor chip for an LCD driver is implemented on a glass substrate.

Next, a state is described that the semiconductor chip 30 for an LCD driver is bonded and implemented on an implementation substrate. FIG. 37 is a drawing showing a case where the semiconductor chip 30 is implemented on a glass substrate 40a (COG: Chip On Glass). As shown in FIG. 37, a glass substrate 40b has been mounted on the glass substrate 40a, thereby forming a display unit of an LCD. On the glass substrate 40a near the display unit of the LCD, the semiconductor chip 30 as a driver for the LCD is mounted. The bump electrodes 37 are formed on the semiconductor chip 30, and the bump electrodes 37 and a terminal formed on the glass substrate 40a are connected via an anisotropic conductive film 42. Also, the glass substrate 40a and a flexible printed circuit 41 are connected via the anisotropic conductive film 42. In this manner, in the semiconductor chip 30 mounted on the glass substrate 40a, the bump electrodes 37 for output are electrically connected to the display unit of the LCD, and the bump electrode 37 for input are connected to the flexible print substrate 41.

Figure 38:
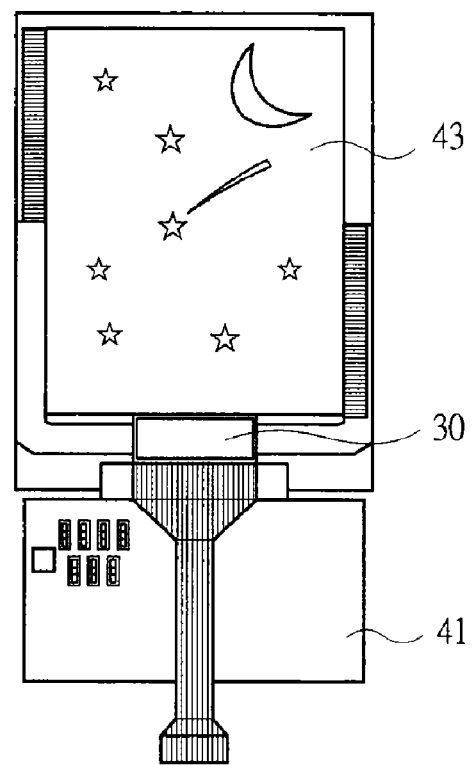
FIG. 38 is a drawing showing a liquid crystal display device.

FIG. 38 is a drawing showing an entire configuration of the LCD. As shown in FIG. 38, a display unit 43 of the LCD is formed on the glass substrate, and an image is displayed on that display unit 43. On the glass substrate near the display unit 43, the semiconductor chip 30 as a driver for the LCD is mounted. The flexible print substrate 41 is mounted near the semiconductor chip 30, and the semiconductor chip 30 as an LCD driver is mounted between the flexible print substrate 41 and the display unit 43 of the LCD. In this manner, the semiconductor chip 30 can be mounted on the glass substrate.

At the time of dicing, flaws occur on the surface of a conforming semiconductor chip due to scattering of the scraps. When the semiconductor chip having the flaw on the front surface is implemented on the glass substrate to configure the liquid-crystal display device, a display defect occurs. However, according to the first embodiment, since scattering of the scraps over the semiconductor wafer can be prevented, the flaw on the front surface of the conforming semiconductor chip can be prevented. Therefore, in the liquid-crystal display device on which the semiconductor chip for an LCD driver is implemented, an occurrence of the display defect can be prevented. That is, according to the first embodiment, reliability of the liquid-crystal display device can be improved.

Next, in the case where the back surface of the semiconductor wafer is grounded and the case where the back surface of the semiconductor wafer is not grounded, a difference in a scrap scattering ratio between the both cases is described. First, a fact that the difference in the scrap scattering ratio is depending on presence or absence of back grinding is qualitatively described.

Figure 39:
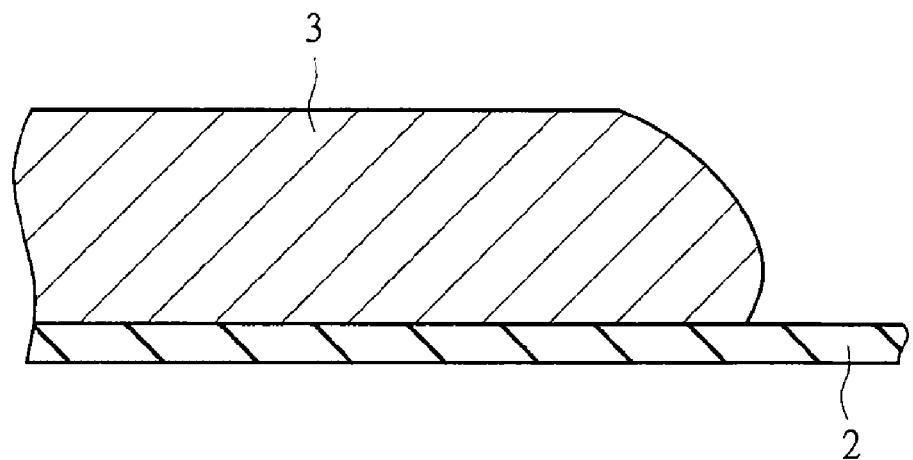
FIG. 39 is a cross-sectional view showing a state where an end of a semiconductor wafer with its back surface being ground and a dicing tape are bonded together.

FIG. 39 is a cross-section view of a state where the dicing tape 2 and an end of the semiconductor wafer 3 are bonded together in the case where the back surface of the semiconductor wafer 3 is ground. As shown in FIG. 39, it can be seen that, since the back surface of the semiconductor wafer 3 is grounded, a curved shape formed at the end of the semiconductor wafer 3 is grounded to planarize the back surface. Therefore, the dicing tape 2 and the irregular-shaped outer peripheries of the semiconductor wafer 3 are firmly bonded together. Therefore, it can be seen that scattering of the scraps occurring due to the cutting-off of the irregular-shaped outer peripheries can be suppressed.

Figure 40:
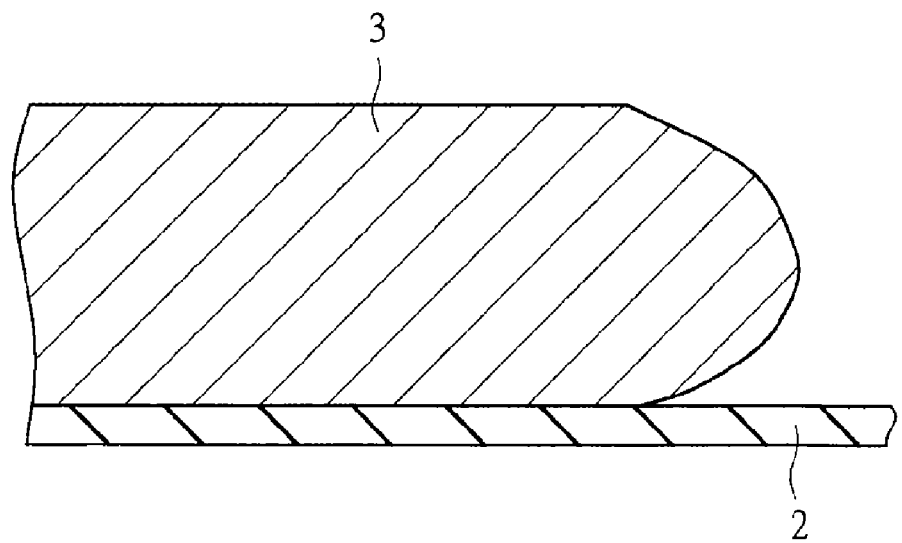
FIG. 40 is a cross-sectional view showing a state where an end of a semiconductor wafer with its back surface being not ground and a dicing tape are bonded together.

In contrast, FIG. 40 is a cross-section view showing a state where the dicing tape 2 and the end of the semiconductor wafer 3 are bonded together in the case where the back surface of the semiconductor wafer 3 is not ground. As shown in FIG. 40, it can be seen that, since the back surface of the semiconductor wafer 3 is not grounded, the curved shape formed at the end of the semiconductor wafer 3 is formed even on the back surface. Therefore, since the end of the semiconductor wafer 3 is curved, adhesiveness to the dicing tape 2 is poor. Therefore, scattering of the scraps occurring due to the cutting-off of the irregular-shaped outer peripheries tends to occur. From the above description, scattering of the scraps tends to occur when the back surface of the semiconductor wafer 3 is not grounded, but when the dicing method in the first embodiment is applied, scattering of the scraps can be prevented. That is, the first embodiment is particularly effective when applied to the process of dicing without grinding the back surface. As a matter of course, even when the back surface is grounded, by performing the dicing method in the first embodiment, scattering of the scraps can be prevented, so that the yield of semiconductor chips can be improved.

Figure 41:
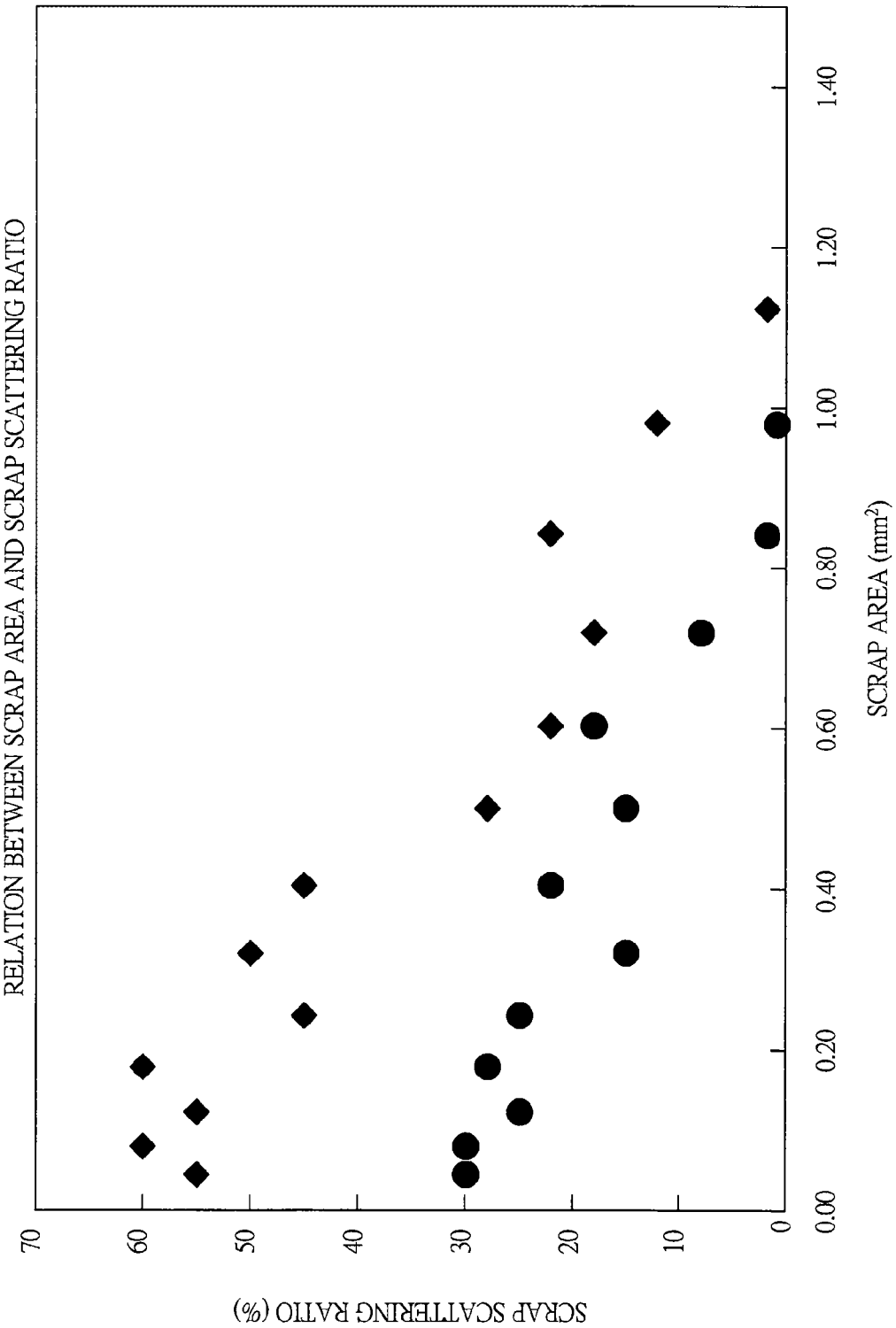
FIG. 41 is a graph showing a relation between a scrap area and a scattering ratio.

Next, the fact that there is a difference in scrap scattering ratio depending on the presence or absence of back grinding is quantitatively described. FIG. 41 is a graph showing a relation between a scrap area and a scrap scattering ratio. In FIG. 41, the horizontal axis represents a scrap area ($mm^2$), while the vertical axis represents a scrap scattering ratio (%). The adhesive force of the dicing tape is 400 g/25 mm before the irradiation with ultraviolet rays, and 25 g/25 mm after the irradiation with ultraviolet rays. In FIG. 41, circles represent values in the case where the back surface of the semiconductor wafer is grounded, while squares represent values in the case where the back surface of the semiconductor wafer is not grounded. As shown in FIG. 41, it can be found that, when the scrap area is equal to or larger than 1.2 $mm^2$, scattering of the scraps does not occur, and as the scrap area decreases from 1.2 $mm^2$, the scrap scattering ratio increases. This can be true irrespectively of the presence or absence of back grinding. Whether the scraps is scattered or not is determined on a boundary of the scrap area (area of the irregular-shaped outer peripheries) of 1.2 $mm^2$.

Assuming a scrap area is the same, it can be found that the scrap scattering ratio is higher in the case where the back surface is grounded than in the case where the back surface is not grounded. For example, when it is assumed that the scrap area is 0.2 $mm^2$, the scattering ratio is approximately 30% when the back surface is grounded, while the scattering ratio is as much as approximately 60% when the back surface is not grounded.

Second Embodiment

In the first embodiment, the example has been described in which the dicing line group in the vertical direction and the dicing line group in the horizontal direction are both formed through the step-cutting. In a second embodiment, an example is described in which either one of the dicing line groups in the vertical or horizontal directions (second dicing line group) is formed through the single-cutting, while the other dicing line group (first dicing line group) is formed through the step-cutting.

Figure 42:
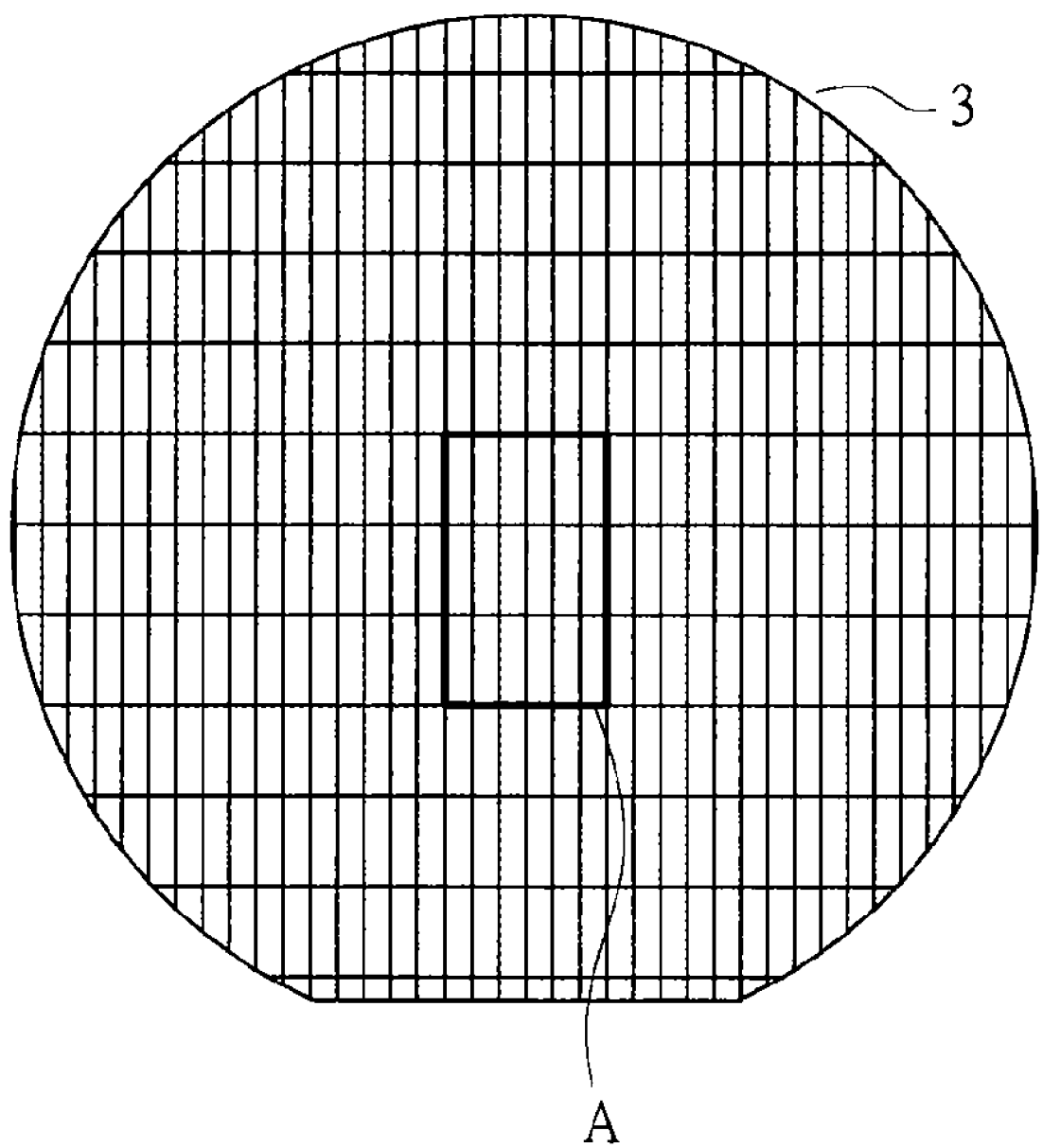
FIG. 42 is a plan view showing a semiconductor wafer in a second embodiment.

FIG. 42 is a plan view showing the semiconductor wafer 3 to which dicing according to the second embodiment is performed. As shown in FIG. 42, semiconductor chips are for use in an LCD driver, and it can be seen that conforming chip area has a rectangular shape.

Figure 43:
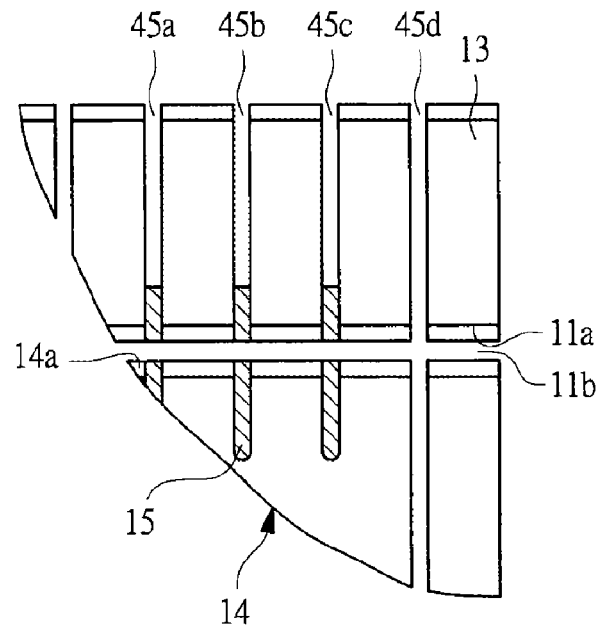
FIG. 43 is an enlarged view of a vicinity of a outer periphery of the semiconductor wafer, and the plan view of a front surface of the semiconductor wafer.
Figure 44:
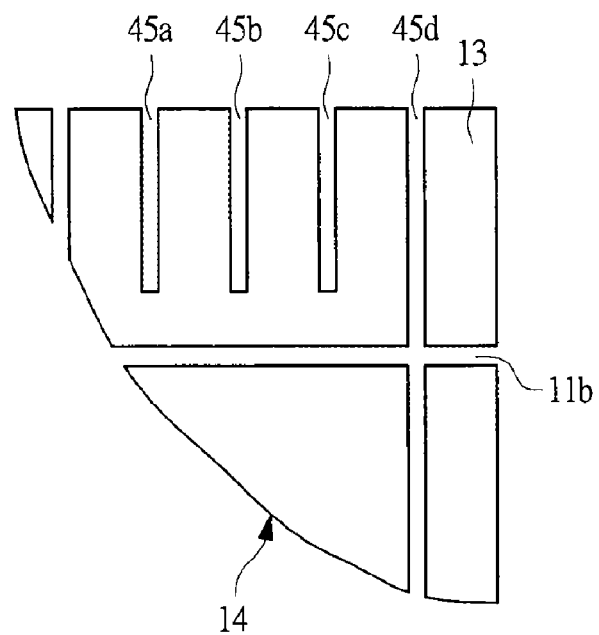
FIG. 44 is an enlarged view of the vicinity of the outer periphery of the semiconductor wafer, and the plan view of a back surface of the semiconductor wafer.

FIG. 43 is an enlarged plan view of a vicinity of the outer periphery 14 of the semiconductor wafer 3, and a plan view of an element formation surface (front surface) of the semiconductor wafer 3. FIG. 44 is an enlarged plan view of the vicinity of the outer periphery 14 of the semiconductor wafer 3, and a plan view of the back surface of the semiconductor wafer 3.

As shown in FIGS. 43 and 44, the outer periphery 14 is cut off by the incision line 11a formed in the horizontal direction and the dicing line 11b and a dicing line 45d formed in the vertical direction. However, since the size of the outer periphery 14 is large, the outer periphery 14 does not become the scrap. In FIGS. 43 and 44, dicing in the horizontal direction is performed through the step-cutting, while dicing in the vertical direction is performed through the single-cutting. The single-cutting is a method of forming a dicing line with one dicing process which is different from the step-cutting of forming a dicing line with the two-stage dicing. With the single-cutting, the width of the dicing line can be narrower compared with the case of the step-cutting. Therefore, the single-cutting is suitable for forming the dicing lines with high density.

As shown in FIGS. 43 and 44, as for dicing lines 45a to 45c, the cutting-off is ended before reaching the outer periphery 14. Therefore, for example, scattering of the scraps occurring due to the cutting-off of an irregular-shaped outer periphery 14a by the dicing line 45a can be prevented. In the second embodiment, the dicing lines 45a to 45c are formed through the single-cutting, and a blade for forming the dicing lines 45a to 45c has a circular shape. Therefore, the dicing lines 45a to 45c are not divided into a completely-cut-off area and a not-completely-cut-off area, but a partially-cut area are present before the completely-cut-off area. That is, as shown in FIG. 43, the dicing lines 45a to 45c are completely cut off before reaching the outer periphery 14, but before these areas, there are areas which are incised by the circular shape of the blade. In FIG. 43, such incised areas are represented as diagonally shaded areas. These areas are partially cut off, and form the non-cut-off portions 15. The non-cut-off portions 15 reach the inside the outer periphery 14. It can be seen that, like the dicing lines 45a to 45c, the dicing lines that are ended before cutting off the irregular-shaped outer peripheries can be formed through the single-cutting. From the above description, also in the second embodiment, the dicing lines 45a to 45c are ended before cutting off the irregular-shaped outer peripheries, thereby preventing scattering of the scraps over the semiconductor wafer and also preventing damage on the front surface of the conforming semiconductor chips. Therefore, the yield of semiconductor chips can be improved.

Figure 45:
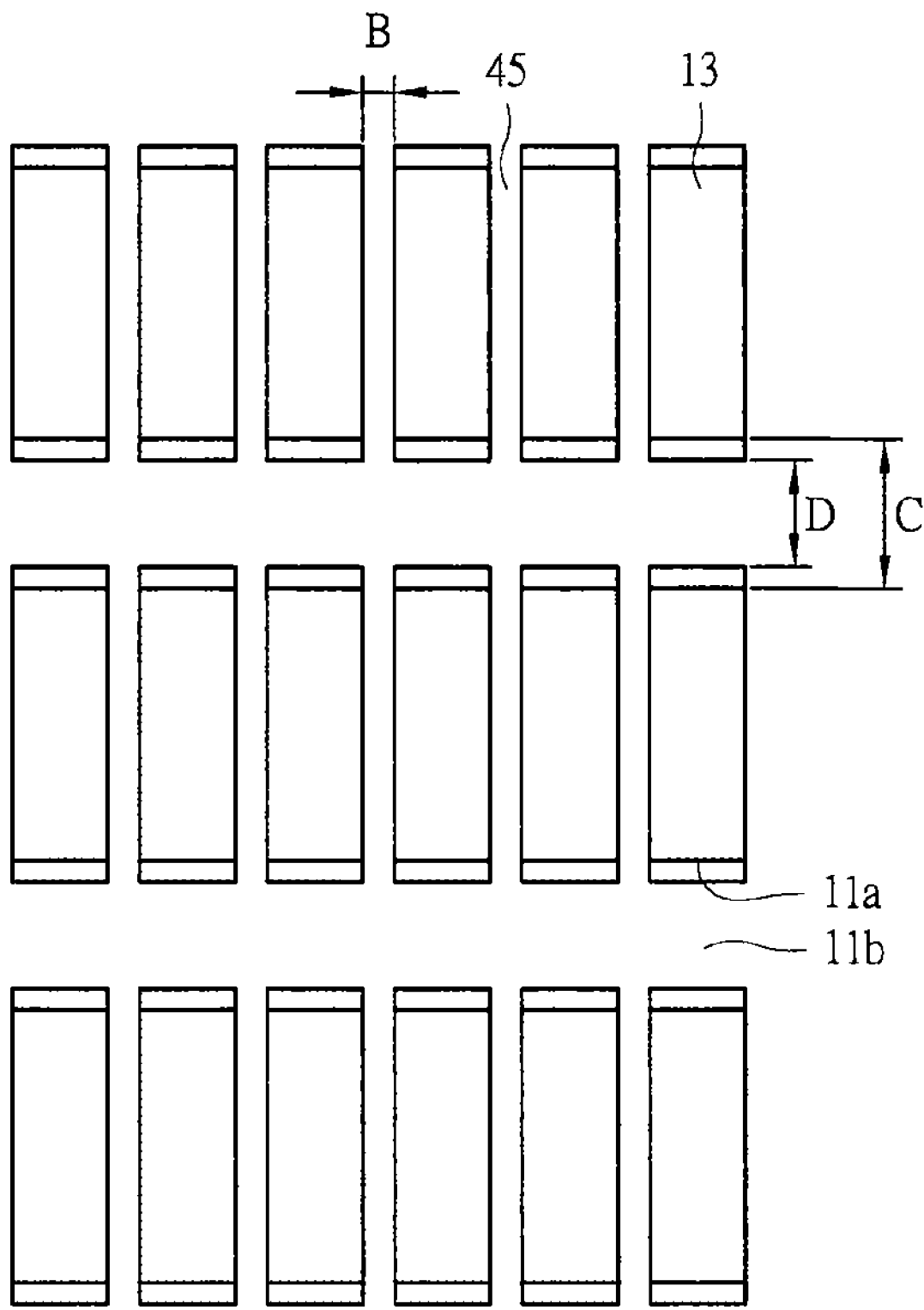
FIG. 45 is an enlarged view of an A area in FIG. 42.

FIG. 45 is an enlarged view of an A area in FIG. 42. As shown in FIG. 45, the individual semiconductor chips 13 are cut off by the incision lines 11a and the dicing line 11b each formed in the horizontal direction and the dicing lines 45 formed in the vertical direction. At this time, the dicing lines 45 are formed through the single-cutting, and a blade thickness of the blade is 25 µm to 30 µm. A width of B of the dicing lines 45 formed with the blade of this thickness is 30 µm. The incision lines 11a formed in the horizontal direction are formed by incising with a blade with a blade thickness of 60 µm to 70 µm, and have a width C of 75 µm. The dicing lines 11b are formed by cutting off with a blade with a blade thickness of 25 µm to 30 µm, and have a width D of 30 µm. In this manner, the dicing lines formed in the horizontal direction (including the incision lines 11a and the dicing lines 11b) and the dicing lines 45 formed in the vertical direction are different in width, and the width of the dicing lines 45 formed in the vertical direction is narrower.

A dicing method using both the step-cutting and the single-cutting will be described. For example, dicing in the horizontal direction is performed through the step-cutting. Specifically, as a first stage of dicing in the horizontal direction, the incision lines 11a are formed on the semiconductor wafer by using a blade. Next, as a second stage of dicing in the horizontal direction, the incision lines 11a are completely cut off to form the dicing lines 11b. In this manner, dicing can be performed with the step-cutting. Next, dicing in the vertical direction is performed through the signal-cutting. Specifically, the dicing lines 45 are formed through the one-stage dicing using a blade.

Here, formation of the incision lines 11a and the dicing lines 11b starts from the outside of the semiconductor wafer, and after the semiconductor wafer is incised or cut off, the formation is ended outside the semiconductor wafer. Similarly, as for most of the plurality of dicing lines 45, the formation thereof starts from the outside of the semiconductor wafer, and, after the semiconductor wafer is cut off, the formation is ended outside the semiconductor wafer. However, as for those of the plurality of dicing lines 45 that may generate the scraps due to the cutting-off of the irregular-shaped outer peripheries, the formation of the dicing lines 45 starts from the outside of the semiconductor wafer, and after the semiconductor wafer is cut off partway, the cutting-off is ended before reaching the irregular-shaped outer peripheries. In this manner, dicing according to the second embodiment can be performed. According to the second embodiment, scattering of the scraps can be prevented, and therefore the manufacturing yield of the conforming semiconductor chips can be improved.

Figure 46:
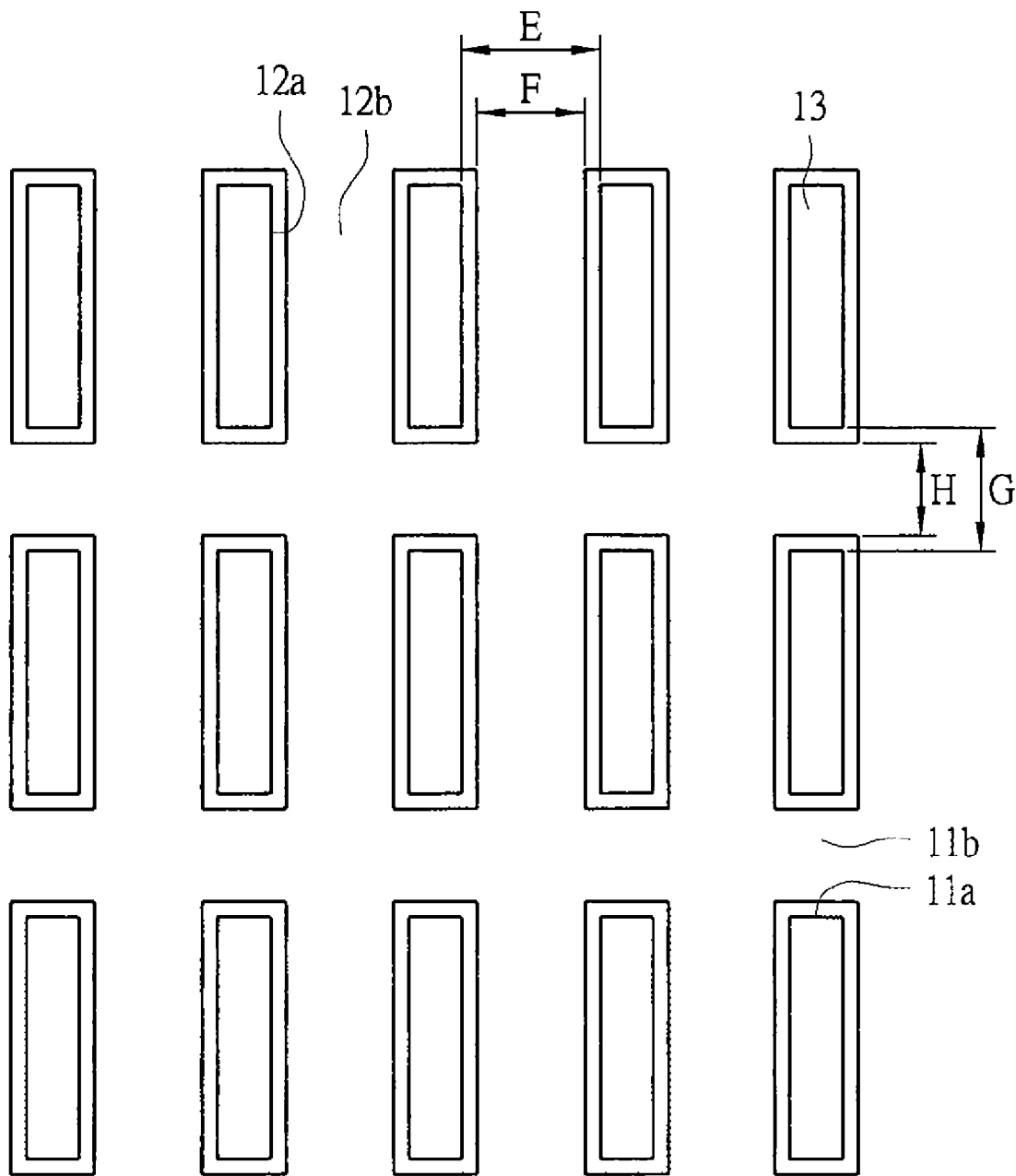
FIG. 46 is a partially-enlarged view of a semiconductor wafer when dicing lines in vertical and horizontal directions are formed through the step-cutting.

FIG. 46 is a drawing showing a case where the dicing lines in both vertical and horizontal directions are formed through the step-cutting. As shown in FIG. 46, the individual semiconductor chips 13 are cut off by the incision lines 11a and the dicing lines 11b formed in the horizontal direction and the incision lines 12a and the dicing lines 12b formed in the vertical direction. At this time, the incision lines 11a and 12a are formed by incising with a blade having a blade thickness of 60 µm to 70 µm, and have widths E and G of 75 µm. On the other hand, the dicing lines 11b and 12b are formed by cutting off with a blade having a blade thickness of 45 µm to 50 µm, and have widths F and H of 55 µm.

When compared between FIGS. 45 and 46, it can be found that the semiconductor chips can be arranged with higher density in the case of FIG. 45 according to the second embodiment than in the case of FIG. 46 according to the first embodiment. Specifically, when it is assumed that a size of the semiconductor wafer is φ200 mm and a size of each semiconductor chip is 1.0 mm (short side)×12.0 mm (long side), in the case of FIG. 46, the 2050 semiconductor chips can be obtained per the semiconductor wafer. By contrast, in the case of FIG. 45, the 2185 semiconductor chips can be obtained per the semiconductor wafer. That is, in the semiconductor chips for an LCD driver according to the second embodiment, dicing in the short side direction is performed through the single-cutting, the ratio of obtaining semiconductor chips can be increased by approximately 6.5%. From the above description, according to the second embodiment, scattering of the scraps can be prevented while the ratio of obtaining semiconductor chips is increased.

Hereinabove, the invention made by the present inventors has been described concretely according to the embodiments. However, the present invention is not limited to the above described embodiments, and it goes without saying that various modifications can be made without departing from the gist thereof.

In the above described embodiments, examples of the step-cutting or a combination of the step-cutting and the single-cutting is used have been described. One aspect of the present invention disclosed in the present application can also be applied to a case where only the single-cutting is used.

Also, in the above described embodiments, the semiconductor chip (semiconductor device) for an LCD driver has been described. One aspect of the present invention disclosed in the present application can also be applied to the dicing process for the semiconductor chips used for other application.

INDUSTRIAL APPLICABILITY

One aspect of the present invention disclosed in the present application can be widely used in an industry of manufacturing the semiconductor devices.

The invention claimed is:

1. A method for fabricating a semiconductor device comprising the steps of:
   (a) forming a first dicing line group including a plurality of first dicing lines by dicing along a first direction of a semiconductor wafer; and
   (b) forming a second dicing line group including a plurality of second dicing lines by dicing the semiconductor wafer along a second direction perpendicular to the first direction,
   wherein in the (a) step, dicing starts from an outside of the semiconductor wafer, and after cutting off the semiconductor wafer, dicing is ended outside the semiconductor wafer, and
   the (b) step includes the steps of:
   (b1) starting dicing from the outside of the semiconductor wafer, cutting off the semiconductor wafer, and then ending dicing outside the semiconductor wafer; and
   (b2) starting dicing from the outside of the semiconductor wafer and ending dicing inside the semiconductor wafer.

2. The method for fabricating a semiconductor device according to claim 1,
   wherein in the (b2) step, dicing is ended before cutting off an irregular-shaped outer periphery formed on an outer periphery of the semiconductor wafer.

3. The method for fabricating a semiconductor device according to claim 1,
   wherein in the (b2) step, dicing is ended before reaching the irregular-shaped outer periphery formed on the outer periphery of the semiconductor wafer.

4. The method for fabricating a semiconductor device according to claim 1,
   wherein, among a plurality of irregular-shaped outer peripheries formed on an outer periphery of the semiconductor wafer, for an irregular-shaped outer periphery to be scattered over the semiconductor wafer when being cut off, the (b2) step is performed and dicing is ended before cutting off.

5. The method for fabricating a semiconductor device according to claim 4,
   wherein the irregular-shaped outer periphery to be scattered over the semiconductor wafer when being cut off is formed on the outer periphery of the semiconductor wafer through which a blade for dicing passes when cutting through the semiconductor wafer.

6. The method for fabricating a semiconductor device according to claim 2,
   wherein the irregular-shaped outer periphery has a substantially triangular shape.

7. The method for fabricating a semiconductor device according to claim 1,
   wherein the (b) step is performed after the (a) step is performed.

8. The method for fabricating a semiconductor device according to claim 1,
   wherein a part of the second dicing line group is formed by performing the (b1) step, and other part of the second dicing line group is formed by performing the (b2) step.

9. The method for fabricating a semiconductor device according to claim 2,
   wherein the (b2) step is performed only to a dicing line among the second dicing line group in which the irregular-shaped outer periphery is cut off if the (b1) step is performed, and the (b1) step is performed to other dicing lines.

10. The method for fabricating a semiconductor device according to claim 1,
    wherein in the (a) step, each of the plurality of first dicing lines included in the first dicing line group is formed in a two-stage step, and in the (b) step, each of the plurality of second dicing lines included in the second dicing line group is formed in the two-stage step.

11. The method for fabricating a semiconductor device according to claim 10,
    wherein the two-stage step includes the steps of:
    (c) incising partway the semiconductor wafer in thickness; and
    (d) cutting off the semiconductor wafer that has been incised partway to form one dicing line.

12. The method for fabricating a semiconductor device according to claim 11,
    wherein in the (c) step, the semiconductor wafer is incised with a first width, and
    in the (d) step, the semiconductor wafer is cut off with a second width narrower than the first width.

13. The method for fabricating a semiconductor device according to claim 11,
    wherein when a part of the dicing lines of the second dicing line group is formed, in the (c) step, a processing is performed from the outside of the semiconductor wafer, and is ended outside the semiconductor wafer after the semiconductor wafer is cut off, and
    in the (d) step, a processing is performed from the outside of the semiconductor wafer, and is ended inside the semiconductor wafer.

14. The method for fabricating a semiconductor device according to claim 13,
    wherein the part of the dicing lines are dicing lines by which the irregular-shaped outer periphery formed on the outer periphery of the semiconductor wafer is cut off in a case where a cutting-off of the semiconductor wafer is ended outside the semiconductor wafer in the (d) step.

15. The method for fabricating a semiconductor device according to claim 13,
    wherein in the (d) step, the cutting-off of the semiconductor wafer is ended before reaching the irregular-shaped outer periphery formed on the outer periphery of the semiconductor wafer.

16. The method for fabricating a semiconductor device according to claim 1,
    wherein in the (a) step, each of the plurality of first dicing lines included in the first dicing line group is formed in a two-stage step, and
    in the (b) step, each of the plurality of second dicing lines included in the second dicing line group is formed in a one-stage step.

17. The method for fabricating a semiconductor device according to claim 16,
    wherein an interval between the plurality of first dicing lines included in the first dicing line group is different from a interval between the plurality of second dicing lines included in the second dicing line group.

18. The method for fabricating a semiconductor device according to claim 17, wherein the interval between the plurality of second dicing lines included in the second dicing line group is narrower than the interval between the plurality of first dicing lines included in the first dicing line group.

19. The method for fabricating a semiconductor device according to claim 1, further comprising the step of:

in the semiconductor wafer on which the first dicing line group and the second dicing line group are formed, expanding a width of the plurality of first dicing lines included in the first dicing line group and a width of the plurality of second dicing lines included in the second dicing line group.

20. The method for fabricating a semiconductor device according to claim 19, further comprising the step of:

from the semiconductor wafer in which the width of the plurality of first dicing lines and the width of the plurality of second dicing lines are expanded, obtaining a plurality of semiconductor chips distributed by the plurality of first dicing lines and the plurality of second dicing lines.

21. The method for fabricating a semiconductor device according to claim 20, wherein each of the plurality of semiconductor chips has a rectangular shape.

22. The method for fabricating a semiconductor device according to claim 21, wherein a ratio of a length of a short side to a length of a long side is 1:8 to 1:12 in each of the plurality of semiconductor chips.

23. The method for fabricating a semiconductor device according to claim 21, wherein a length of a long side of each of the plurality of semiconductor chips is equal to or longer than 5 mm.

24. The method for fabricating a semiconductor device according to claim 20, wherein the plurality of semiconductor chips are each used for an LCD driver.

25. The method for fabricating a semiconductor device according to claim 1, wherein dicing is performed to the semiconductor wafer in a state where a dicing tape is attached to a back surface of the semiconductor wafer, and the back surface of thereof is not grounded.

* * * * *